(12) United States Patent
Srivastava

(10) Patent No.: US 8,806,308 B2
(45) Date of Patent: Aug. 12, 2014

(54) BOSE-CHAUDHURI-HOCQUENGHEM (BCH) DECODER

(71) Applicant: Ankush Srivastava, Noida (IN)

(72) Inventor: Ankush Srivastava, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 103 days.

(21) Appl. No.: 13/735,052

(22) Filed: Jan. 7, 2013

(65) Prior Publication Data

US 2014/0195881 A1    Jul. 10, 2014

(51) Int. Cl.
*H03M 13/00* (2006.01)
*H03M 13/15* (2006.01)

(52) U.S. Cl.
CPC ........... *H03M 13/152* (2013.01); *H03M 13/15* (2013.01); *H03M 13/151* (2013.01)
USPC ........................................................ 714/782

(58) Field of Classification Search
CPC .. H03M 13/15; H03M 13/152; H03M 13/151
USPC ........................................................ 714/782
See application file for complete search history.

(56) References Cited

U.S. PATENT DOCUMENTS

| | | | |
|---|---|---|---|
| 4,958,349 A * | 9/1990 | Tanner et al. | 714/759 |
| 7,206,992 B2 * | 4/2007 | Xin | 714/782 |
| 7,810,015 B2 | 10/2010 | Paumier et al. | |
| 7,823,050 B2 * | 10/2010 | Gasanov et al. | 714/782 |
| 7,853,854 B2 | 12/2010 | Paumier et al. | |
| 2003/0131308 A1 * | 7/2003 | Lee et al. | 714/781 |
| 2009/0217140 A1 * | 8/2009 | Jo et al. | 714/785 |
| 2009/0259921 A1 * | 10/2009 | Chang et al. | 714/782 |
| 2012/0072809 A1 * | 3/2012 | Kong et al. | 714/782 |
| 2012/0075940 A1 * | 3/2012 | Toda | 365/189.15 |
| 2014/0108887 A1 * | 4/2014 | Hida et al. | 714/764 |

OTHER PUBLICATIONS

James L. Massey, "Shift-register Synthesis and BCH Decoding", IEEE Transactions on Information Theory, vol. IT-15, No. 1, pp. 122-127, Jan. 1969.

R.T. Chien, Cyclic Decoding Procedures for Bose-Chaudhuri-Hocquenghen Codes, IEEE Transactions on Information Theory, Oct. 1964, pp. 357-363.

* cited by examiner

*Primary Examiner* — John Trimmings
(74) *Attorney, Agent, or Firm* — Charles Bergere

(57) ABSTRACT

A decoder for decoding a set of bits encoded using a Bose-Chaudhuri-Hocquenghem (BCH) error-correcting code (ECC) includes a syndrome generator, a key equation solver, and an error bit locator. The syndrome generator receives the set of encoded bits and generates a set of syndromes. The key equation solver generates an error location polynomial based on the set of syndromes. The error bit locator generates an error match bit using the error location polynomial, and the error match bit is used to identify and correct errors in the set of encoded bits.

20 Claims, 7 Drawing Sheets

BOSE-CHAUDHURI-HOCQUENGHEM (BCH) DECODER

BACKGROUND OF THE INVENTION

The present invention relates generally to error-correcting code (ECC) decoders, and, more particularly, to a Bose-Chaudhuri-Hochquenghem (BCH) decoder.

The memory industry has witnessed a rise in the use of embedded static random access memory (SRAM) and multi-level NAND/NOR flash memory devices that are used in functional safety systems of automotive, industrial, and health care applications. The rise may be attributed primarily to the memory size versus cost advantage offered by such devices. However, the NAND/NOR flash memory devices are less reliable than other memory types (viz., embedded SRAM and other flash memories) and are prone to soft errors in which the bits stored in such memories are flipped. The reliability is further reduced when the memories are operated in an environment that is exposed to high-energy cosmic rays, alpha, and solar particles, causing an increased incidence of soft errors.

The critical nature of functional safety systems requires them to have fault tolerant and resilient architectures and to be compliant with safety standards including ISO 26262 and IEC 61508. Since these memory devices are prone to errors, error-correcting codes (ECCs) are used to ensure compliance with the safety standards. ECCs ensure detection and correction of the data stored in the memory and include Hamming codes, Reed-Solomon (R-S) codes, Bose-Chaudhuri-Hochquenghem (BCH) codes, circular redundancy check codes (CRC), Golay codes, Reed-Muller codes, Goppa codes, and Denniston codes.

BCH ECCs are a popular class of codes used to detect and correct soft errors. Their popularity stems from the relatively simple encoding and decoding processes used by the BCH ECCs. However, like other ECCs, the BCH ECC decoding process is much more complicated than the encoding process and involves execution of a time consuming algorithm generally performed with specialized hardware, i.e., a BCH decoder. The complexity of the decoding algorithm increases with an increase in a count of bit errors that can be corrected by the ECC, which translates into a more complicated design of the BCH decoder. The increase in design complexity increases the silicon area required by the BCH decoder as well as the processing time, which leads to increased cost.

Therefore, it would be advantageous to have a BCH decoder that has a simpler implementation, requires less silicon area, and operates faster, and that overcomes the above-mentioned limitations of conventional BCH decoders.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
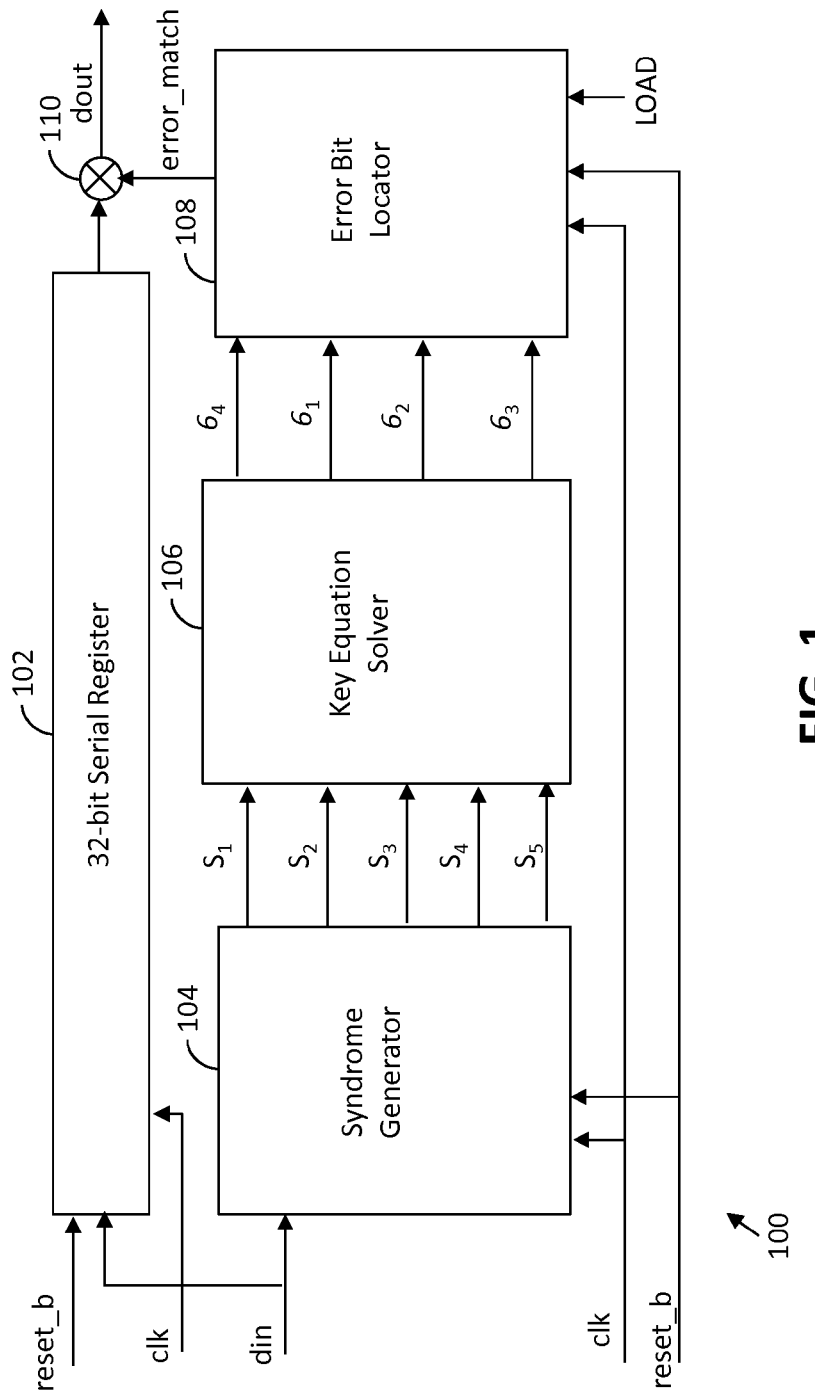
FIG. 1 is a schematic block diagram of a BCH decoder in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein the term multiplexer has been sometimes abbreviated as mux.

In an embodiment of the present invention, a decoder is provided. The decoder includes a syndrome generator that receives a set of encoded bits and generates corresponding set of syndromes based on a clock signal. The decoder further includes a key equation solver that is connected to the syndrome generator and determines an error location polynomial using the set of syndromes. The key equation solver determines first through fourth coefficients of the error location polynomial. Each of the first through fourth coefficients include first through fifth bits. The key equation solver includes: a first polynomial basis multiplier circuit for determining a first product that is a product of first and second syndromes; a first finite field inversion circuit for determining a first inverse that is a multiplicative inverse of the first syndrome; a first finite field adder circuit, connected to the first polynomial basis multiplier circuit, for determining a first finite field sum that is a sum of the first product and a third syndrome; a second finite field inversion circuit connected to the first adder circuit for determining a second inverse that is a multiplicative inverse of the first sum; a second polynomial basis multiplier circuit, connected to the first adder circuit and the first inversion circuit, for determining a second product that is a product of the first sum and the first inverse; a third polynomial basis multiplier circuit, connected to the second polynomial basis multiplier circuit, for determining a third product that is a product of the second product and the third syndrome; a fourth polynomial basis multiplier circuit for determining a fourth product that is a product of the first syndrome and a fourth syndrome; a second finite field adder circuit, connected to the fourth polynomial basis multiplier circuit, for determining a second finite field sum that is a sum of the fourth product and a fifth syndrome; a third finite field adder circuit, connected to the second finite field adder circuit and the third polynomial basis multiplier circuit, for determining a third finite field sum that is a sum of the third product and the second finite field sum; a fifth polynomial basis multiplier circuit, connected to the third finite field adder circuit and the second finite field inversion circuit, for determining a fifth product that is a product of the third finite field sum and the second finite field inverse; a fourth finite field adder circuit, connected to the second and fifth polynomial basis multiplier circuits, for determining a fourth finite field sum that is a sum of the second and fifth products; and a sixth polynomial basis multiplier circuit, connected to the fifth polynomial basis multiplier circuit, for determining a sixth product that is a product of the fifth product and the first syndrome. The first coefficient is the first syndrome, the second coefficient is the fourth finite field sum, the third coefficient is the sixth product, and the fourth coefficient is binary one. The decoder further includes a serial bit register for receiving the set of encoded bits and outputting an encoded bit at each active edge of the clock signal. An error bit locator is connected to the key equation solver for identifying an erroneous encoded bit by generating an error match bit based on the first through fourth coefficients of the error location polynomial. A first XOR gate is connected to the serial bit register and the error bit locator for generating a decoded bit based on the encoded bit and the error match bit. In another embodiment of the present invention, the decoder is a Bose-Chaudhuri-Hocquenghem (BCH) decoder and is used in a memory device for rectifying soft errors in the memory device.

Various embodiments of the present invention provide a Bose-Chaudhuri-Hocquenghem (BCH) decoder for decoding a set of encoded bits encoded using BCH error-correcting code (ECC). The BCH decoder includes a syndrome generator, a key equation solver, and an error bit locator. The syndrome generator receives the set of encoded bits and generates a set of syndromes that are used by the key equation solver to generate an error location polynomial. The error location polynomial is transmitted to the error bit locator and the error bit locator generates an error match bit which is used to identify and correct errors in the set of encoded bits. Upon inputting the set of encoded bits, the BCH decoder generates a decoded bit with a latency of one clock cycle and increases the processing speed of the BCH decoder. The BCH decoder can be provided with the set of encoded bits at either of the positive and negative edges of the clock cycle which improves the throughput of the BCH decoder. Further, the key equation solver is implemented using a combinational circuit (i.e., does not use flip-flops) which reduces the design complexity and processing time, and further reduces the silicon area and power consumption of the BCH decoder. The BCH decoder can be used in a memory device for rectifying the soft errors therein.

Referring now to FIG. 1, a schematic block diagram depicting a Bose-Chaudhuri-Hochquenghem (BCH) decoder 100 for decoding a set of encoded bits in accordance with an embodiment of the present invention, is shown. The BCH decoder 100 includes a serial bit register 102, a syndrome generator 104, a key equation solver 106, an error bit locator 108, and a first XOR gate 110.

The serial bit register 102 receives a clock signal (clk) and a reset signal (reset_b). The serial bit register 102 is provided with the set of encoded bits by way of an input signal ($D_{in}$). In an example, the set of encoded bits includes a sequence of 31 encoded bits that may have a maximum of three erroneous encoded bits and each encoded bit is provided at a positive edge of the clock signal clk to the serial bit register 102. In an embodiment of the present invention, the serial bit register 102 is a 32-bit serial register and is capable of storing a maximum count of 32 bits and stores the 31 encoded bits. The set of encoded bits is encoded using BCH error-correcting code (ECC) that is known to those skilled in the art and is read from a memory device, viz., NAND/NOR flash memory, embedded synchronous random access memory (SRAM), and so forth. The set of encoded bits is parsed through the BCH decoder 100 to identify and correct one or more erroneous encoded bits. In an embodiment of the present invention, the BCH decoder 100 is implemented on a Galois field GF ($2^5$).

The set of encoded bits is also transmitted to the syndrome generator 104 using the input signal $D_{in}$. The syndrome generator 104 receives the clock signal clk and the reset signal reset_b. The syndrome generator 104 and the serial bit register 102 simultaneously receive each encoded bit at the positive edge of the clock signal clk. The syndrome generator 104 begins to process the set of encoded bits after the complete set of encoded bits has been received, i.e., after 31 positive edges of the clock signal clk in the above example and calculates a set of syndromes, including first through fifth syndromes, i.e., $S_1$-$S_5$, corresponding to the received set of encoded bits. The set of encoded bits may represent a polynomial (an encoded bit polynomial) over the Galois field GF($2^5$). The syndrome generator 104 is implemented in a manner known to those of skill in the art and using any suitably known technique, viz., Horner's scheme. The syndrome generator 104 divides the encoded bit polynomial by a generator polynomial to generate the first through fifth syndromes $S_1$-$S_5$. In an embodiment of the present invention, each of the first through fifth syndromes $S_1$-$S_5$ include five bits. The first through fifth syndromes $S_1$-$S_5$ are transmitted to the key equation solver 106. The key equation solver 106 determines an error location polynomial using the first through fifth syndromes $S_1$-$S_5$ and determines first through fourth coefficients $6_1$-$6_4$ of the error location polynomial, in which each of the first through fourth coefficients $6_1$-$6_4$ includes first through fifth bits. The key equation solver 106 has been described later in detail in conjunction with FIGS. 2, 3, and 4. Subsequent to receiving the set of encoded bits, the load signal transitions to logic high state which signals the key equation solver 106 to transmit the first through fourth coefficients $6_1$-$6_4$ to the error bit locator 108.

The error bit locator 108 receives the error location polynomial and identifies an erroneous encoded bit of the set of encoded bits by generating an error match bit based on the first through fourth coefficients $6_1$-$6_4$ of the error location polynomial. The error bit locator 108 has been described in detail in conjunction with FIGS. 5A, 5B, and 5C. The error bit locator 108 transmits the error match bit to the first XOR gate 110. The first XOR gate 110 receives each bit of the set of encoded bits and the error match bit corresponding to each bit of the set of encoded bits. The first XOR gate 110 flips the bit of the set of encoded bits when the corresponding error match bit is in logic high state. In an embodiment of the present invention, the error match bit may be used to detect and correct a maximum of three errors in the set of encoded bits.

Figure 2:
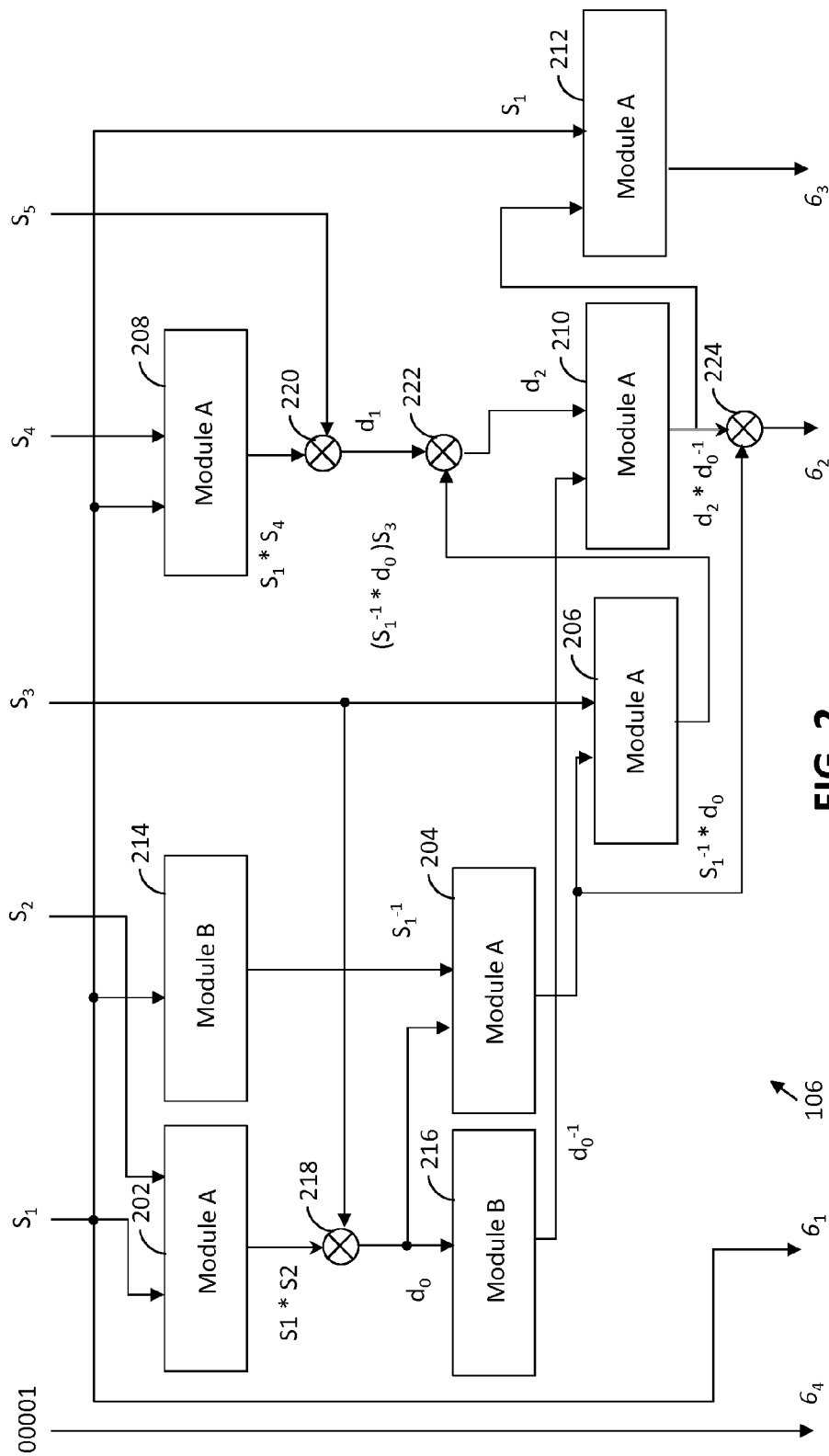
FIG. 2 is a schematic block diagram of a key equation solver in accordance with an embodiment of the present invention.

Referring now to FIG. 2, a schematic block diagram depicting the key equation solver 106 in accordance with an embodiment of the present invention is shown. The key equation solver 106 includes first through sixth polynomial basis multiplier circuits 202-212, first and second finite field inversion circuits 214 and 216, and first through fourth finite field adder circuits 218-224.

The first polynomial basis multiplier circuit 202 receives and multiplies the first and second syndromes $S_1$ and $S_2$ to generate a first product ($S_1 * S_2$). The multiplication is performed according to the Galois field GF ($2^5$) polynomial multiplication. The first product $S_1 * S_2$ is provided to the first finite field adder circuit 218. The first finite field adder circuit 218 also receives the third syndrome $S_3$ and adds the third syndrome $S_3$ and the first product $S_1 * S_2$ according to the Galois field GF($2^5$) polynomial addition and generates a first finite field sum ($d_0$). The first finite field sum $d_0$ is provided to the second finite field inversion circuit 216 that generates a second inverse $d_0$ that is a multiplicative inverse of the first finite field sum $d_0$ according to the Galois field GF($2^5$) polynomial inversion. Further, the first finite field inversion circuit 214 is provided with the first syndrome $S_1$ for generating a first inverse $S_1$ that is a multiplicative inverse of the first syndrome $S_1$. The first inverse $S_1^{-1}$ is provided to the second polynomial basis multiplier circuit 204 that also receives the first finite field sum $d_0$. The second polynomial basis multiplier circuit 204 multiplies the first finite field sum $d_0$ and the first inverse $S_1^{-1}$ to generate a second product $S_1^{-1}*d_0$. The second product $S_1^{-1}*d_0$ is provided to the third polynomial basis multiplier circuit 206. The third polynomial basis multiplier circuit 206 also receives the third syndrome $S_3$ and multiplies the third syndrome $S_3$ and the second product $S_1^{-1}*d_0$ to generate a third product $(S_3*(S_1*d_0))$. Further, the fourth polynomial basis multiplier circuit 208 receives and multiplies the first and fourth syndromes $S_1$ and $S_4$ to generate a fourth product $(S_1*S_4)$. The fourth product $S_1*S_4$ is provided to the second finite field adder circuit 220. The second finite field adder circuit 220 also receives the fifth syndrome $S_5$ and adds the fourth product $S_1*S_4$ and the fifth syndrome $S_5$ to generate a second finite field sum $(d_1)$.

The second finite field sum $d_1$ is provided to the third finite field adder circuit 222. The third finite field adder circuit 222 also receives the third product $S_3*(S_1^{-1}*d_0)$ and adds the second finite field sum $d_1$ and the third product $S_3*(S_1^{-1}*d_0)$ to generate a third finite field sum $(d_2)$. The third finite field sum $d_2$ is provided to the fifth polynomial basis multiplier circuit 210. The fifth polynomial basis multiplier circuit 210 also receives the second inverse $d_0^{-1}$ multiplies the third finite field sum $d_2$ and the second inverse $d_0^{-1}$ to generate a fifth product $(d_2*d_0^{-1})$. The fifth product $d_2*d_0^{-1}$ is provided to the fourth finite field adder circuit 224. The fourth finite field adder circuit 224 also receives the second product $S_1^{-1}*d_0$ and adds the fifth product $d_2*d_0^{-1}$ and the second product $S_1^{-1}*d_0$ to generate a fourth finite field sum $(d_2*d_0^{-1}+S_1^{-1}*d_0)$. The fourth finite field sum $d_2*d_0^{-1}+S_1^{-1}*d_0$ is output as the second coefficient $6_2$ of the error location polynomial. The fourth finite field sum $d_2*d_0^{-1}+S_1^{-1}*d_0$ is provided to the sixth polynomial basis multiplier circuit 212. The sixth polynomial basis multiplier circuit 212 also receives the first syndrome $S_1$ and multiplies the fourth finite field sum $d_2*d_0^{-1}+S_1^{-1}*d_0$ and the first syndrome $S_1$ to generate a sixth product $(S_1*(d_2*d_0^{-1}+S_1^{-1}*d_0))$. The sixth product $S_1*(d_2*d_0^{-1}+S_1^{-1}*d_0)$ is output as the third coefficient $6_3$ of the error location polynomial. Further, binary value 00001 is output as the fourth coefficient $6_4$ of the error location polynomial and the first syndrome $S_1$ is output as the first coefficient $6_1$ of the error location polynomial.

Figure 3:
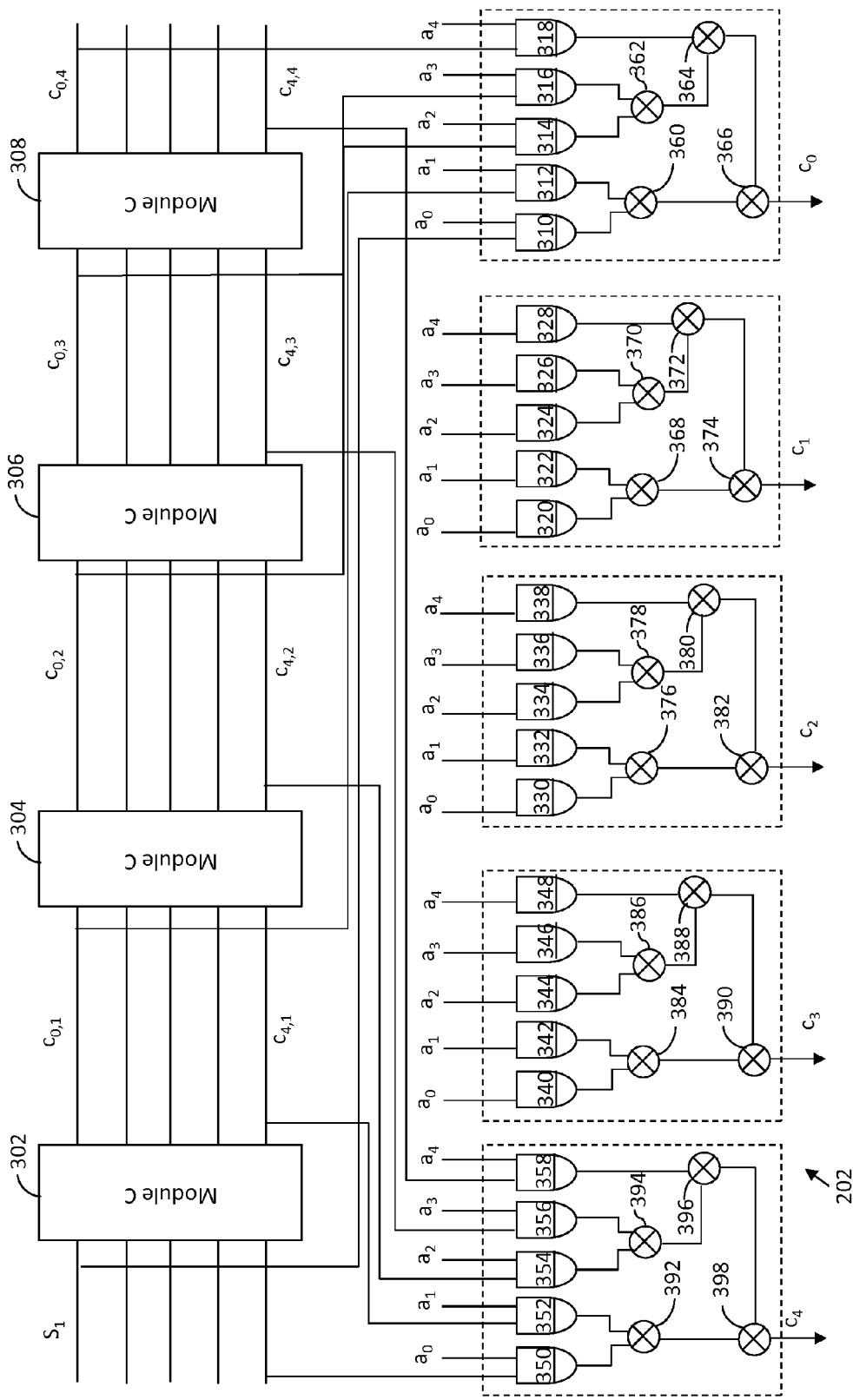
FIG. 3 is a schematic block diagram of a polynomial basis multiplier circuit in accordance with an embodiment of the present invention.

Referring now to FIG. 3, a schematic block diagram depicting the polynomial basis multiplier circuit 202 in accordance with an embodiment of the present invention, is shown. The polynomial basis multiplier circuit 202 includes first through fourth finite field multiplier circuits 302-308, first through twenty-fifth AND gates 310-358, and first through twentieth binary adder circuits 360-392.

The first finite field multiplier circuit 302 is provided with the first through fifth bits of the first syndrome $S_1$. The first finite field multiplier circuit 302 generates a first intermediate product by finite field multiplication equivalent to multiplying a first polynomial (having one or more terms of a finite field variable α) that includes first through fifth coefficients equal to the first through fifth bits of the first syndrome $S_1$, respectively, with the finite field variable α. In an example, $$S_1 = a_0 + a_1\alpha + a_2\alpha^2 + a_3\alpha^3 + a_4\alpha^4 \quad (1)$$

$$S_1*\alpha = a_0\alpha + a_1\alpha^2 + a_2\alpha^3 + a_3\alpha^4 + a_4\alpha^5 \quad (2)$$

According to the Galois field $GF(2^5)$ polynomial multiplication, equation (2) can be resolved as equation (3):

$$S_1*\alpha = a_4 + a_0\alpha + (a_1+a_4)\alpha^2 + a_2\alpha^3 + a_3\alpha^4 \quad (3)$$

Therefore, the first intermediate product is equal to the equation (3) and includes first through fifth bits $(c_{0,1}-c_{4,1})$ that are equal to coefficients of the terms of the finite field variable α in the equation (3).

The first through fifth bits $(c_{0,1}-c_{4,1})$ are transmitted to the second finite field multiplier circuit 304 that generates a second intermediate product by finite field multiplication equivalent to multiplying a second polynomial (having one or more terms of the finite field variable α) that includes first through fifth coefficients equal to first through fifth bits of the first intermediate product, respectively, with the finite field variable α. The second product includes first through fifth bits $(c_{0,2}-c_{4,2})$ that are transmitted to the third finite field multiplier circuit 306. The third finite field multiplier circuit 306 generates a third intermediate product by finite field multiplication equivalent to multiplying a third polynomial (having one or more terms of the finite field variable α) that includes first through fifth coefficients equal to first through fifth bits of the second intermediate product, respectively, with the finite field variable α. The third product includes first through fifth bits $(c_{0,3}-c_{4,3})$ that are transmitted to the fourth finite field multiplier circuit 308. The fourth finite field multiplier circuit 308 generates a fourth intermediate product by finite field multiplication equivalent to multiplying a fourth polynomial (having one or more terms of the finite field variable α) that includes first through fifth coefficients equal to first through fifth bits of the third intermediate product, respectively, with the finite field variable α. The fourth product includes first through fifth bits $(c_{0,4}-c_{4,4})$.

Further, the first through fifth bits of the first syndrome $S_1$ are provided to the first, sixth, eleventh, sixteenth, and twenty-first AND gates 310, 320, 330, 340, and 350, respectively, at first input terminals thereof. The first through fifth bits of the first intermediate product $c_{0,1}-c_{4,1}$ are provided to the second, seventh, twelfth, seventeenth, and twenty-second AND gates 312, 322, 332, 342, and 352, respectively, at first input terminals thereof. The first through fifth bits of the second intermediate product $c_{0,2}-c_{4,2}$ are provided to the third, eighth, thirteenth, eighteenth, and twenty-third AND gates 314, 324, 334, 344, and 354, respectively, at first input terminals thereof. The first through fifth bits of the third intermediate product $c_{0,3}-c_{4,3}$ are provided to the fourth, ninth, fourteenth, nineteenth, and twenty-fourth AND gates 316, 326, 336, 346, and 356, respectively, at first input terminals thereof. The first through fifth bits of the fourth intermediate product $c_{0,4}-c_{4,4}$ are provided to the fifth, tenth, fifteenth, twentieth, and twenty-fifth AND gates 318, 328, 338, 348, and 358, respectively, at first input terminals thereof.

Further, the first through fifth AND gates 310-318 also receive the first through fifth bits $a_0-a_4$ of the second syndrome $S_2$, respectively, at second input terminals thereof and generate first through fifth intermediate bits at output terminals thereof. The sixth through tenth AND gates 320-328 receive the first through fifth bits $a_0-a_4$ of the second syndrome $S_2$, respectively, at second input terminals thereof and generate sixth through tenth intermediate bits at output terminals thereof. The eleventh through fifteenth AND gates 330-338 receive the first through fifth bits $a_0-a_4$ of the second syndrome $S_{er}$ respectively, at second input terminals thereof and generate eleventh through fifteenth intermediate bits at output terminals thereof. The sixteenth through twentieth AND gates 340-348 receive the first through fifth bits $a_0-a_4$ of the second syndrome $S_2$, respectively, at second input terminals thereof and generate sixteenth through twentieth intermediate bits at output terminals thereof. The twenty-first through twenty-fifth AND gates 350-358 receive the first through fifth bits $a_0-a_4$ of the second syndrome $S_2$, respectively, at second input terminals thereof and generate twenty-first through twenty-fifth intermediate bits at output terminals thereof.

The output terminals of the first and second AND gates 310 and 212 are connected to the first binary adder circuit 360. The first and second AND gates 310 and 312 transmit the first and second intermediate bits to the first binary adder circuit 360 that adds the first and second intermediate bits to generate a first binary sum. The output terminals of the third and fourth AND gates 314 and 316 are connected to the second binary adder circuit 362. The third and fourth AND gates 314 and 316 transmit the third and fourth intermediate bits to the second binary adder circuit 362 that adds the third and fourth intermediate bits to generate a second binary sum. The output terminal of the fifth AND gate 318 is connected to the third binary adder circuit 364 for transmitting the fifth intermediate bit thereto. The third binary adder circuit 364 is further connected to the second binary adder circuit 362 for receiving the second binary sum. The third binary adder circuit 364 adds the fifth intermediate bit and the second binary sum to generate a third binary sum. The first binary adder circuit 360 is also connected to the fourth binary adder circuit 366 for transmitting the first binary sum thereto. The fourth binary adder circuit 366 is further connected to the third binary adder circuit 364 for receiving the third binary sum. The fourth binary adder circuit 366 adds the first and third binary sums to generate a fourth binary sum that is output as the first bit of the first product $S_1*S_2$.

The output terminals of the sixth and seventh AND gates 320 and 322 are connected to the fifth binary adder circuit 368. The sixth and seventh AND gates 320 and 322 transmit the sixth and seventh intermediate bits to the fifth binary adder circuit 368 that adds the sixth and seventh intermediate bits to generate a fifth binary sum. The output terminals of the eighth and ninth AND gates 324 and 326 are connected to the sixth binary adder circuit 370. The eighth and ninth AND gates 324 and 326 transmit the eighth and ninth intermediate bits to the sixth binary adder circuit 370 that adds the eighth and ninth intermediate bits to generate a sixth binary sum. An output terminal of the tenth AND gate 328 is connected to the seventh binary adder circuit 372 for transmitting the tenth intermediate bit thereto. The seventh binary adder circuit 372 is further connected to the sixth binary adder circuit 362 for receiving the sixth binary sum. The seventh binary adder circuit 372 adds the tenth intermediate bit and the sixth binary sum to generate a seventh binary sum. The fifth binary adder circuit 368 is also connected to the eighth binary adder circuit 374 for transmitting the fifth binary sum thereto. The eighth binary adder circuit 374 is further connected to the seventh binary adder circuit 372 for receiving the seventh binary sum. The eighth binary adder circuit 374 adds the fifth and seventh binary sums to generate an eighth binary sum that is output as the second bit of the first product $S_1*S_2$.

The output terminals of the eleventh and twelfth AND gates 330 and 332 are connected to the ninth binary adder circuit 376. The eleventh and twelfth AND gates 330 and 332 transmit the eleventh and twelfth intermediate bits to the ninth binary adder circuit 376 that adds the eleventh and twelfth intermediate bits to generate a ninth binary sum. The output terminals of the thirteenth and fourteenth AND gates 334 and 336 are connected to the tenth binary adder circuit 378. The thirteenth and fourteenth AND gates 334 and 336 transmit the thirteenth and fourteenth intermediate bits to the tenth binary adder circuit 378 that adds the thirteenth and fourteenth intermediate bits to generate a tenth binary sum. An output terminal of the fifteenth AND gate 338 is connected to the eleventh binary adder circuit 380 for transmitting the fifteenth intermediate bit thereto. The eleventh binary adder circuit 380 is further connected to the tenth binary adder circuit 378 for receiving the tenth binary sum. The eleventh binary adder circuit 380 adds the fifteenth intermediate bit and the tenth binary sum to generate an eleventh binary sum. The ninth binary adder circuit 376 is also connected to the twelfth binary adder circuit 382 for transmitting the ninth binary sum thereto. The twelfth binary adder circuit 382 is further connected to the eleventh binary adder circuit 380 for receiving the eleventh binary sum. The twelfth binary adder circuit 382 adds the ninth and eleventh binary sums to generate a twelfth binary sum that is output as the third bit of the first product $S_1*S_2$.

The output terminals of the sixteenth and seventeenth AND gates 340 and 342 are connected to the thirteenth binary adder circuit 384. The sixteenth and seventeenth AND gates 340 and 342 transmit the sixteenth and seventeenth intermediate bits to the thirteenth binary adder circuit 384 that adds the sixteenth and seventeenth intermediate bits to generate a thirteenth binary sum. The output terminals of the eighteenth and nineteenth AND gates 344 and 346 are connected to the fourteenth binary adder circuit 386. The eighteenth and nineteenth AND gates 344 and 346 transmit the eighteenth and nineteenth intermediate bits to the fourteenth binary adder circuit 386 that adds the eighteenth and nineteenth intermediate bits to generate a fourteenth binary sum. An output terminal of the twentieth AND gate 348 is connected to the fifteenth binary adder circuit 388 for transmitting the twentieth intermediate bit thereto. The fifteenth binary adder circuit 388 is further connected to the fourteenth binary adder circuit 386 for receiving the fourteenth binary sum. The fifteenth binary adder circuit 388 adds the twentieth intermediate bit and the fourteenth binary sum to generate a fifteenth binary sum. The thirteenth binary adder circuit 384 is also connected to the sixteenth binary adder circuit 390 for transmitting the thirteenth binary sum thereto. The sixteenth binary adder circuit 390 is further connected to the fifteenth binary adder circuit 386 for receiving the fifteenth binary sum. The sixteenth binary adder circuit 390 adds the thirteenth and fifteenth binary sums to generate a sixteenth binary sum that is output as the fourth bit of the first product $S_1*S_2$.

The output terminals of the twenty-first and twenty-second AND gates 350 and 352 are connected to the seventeenth binary adder circuit 392. The twenty-first and twenty-second AND gates 350 and 352 transmit the twenty-first and twenty-second intermediate bits to the seventeenth binary adder circuit 392 that adds the twenty-first and twenty-second intermediate bits to generate a seventeenth binary sum. The output terminals of the twenty-third and twenty-fourth AND gates 354 and 356 are connected to the eighteenth binary adder circuit 394. The twenty-third and twenty-fourth AND gates 354 and 356 transmit the twenty-third and twenty-fourth intermediate bits to the eighteenth binary adder circuit 394 that adds the twenty-third and twenty-fourth intermediate bits to generate an eighteenth binary sum. An output terminal of the twenty-fifth AND gate 358 is connected to the nineteenth binary adder circuit 396 for transmitting the twenty-fifth intermediate bit thereto. The nineteenth binary adder circuit 396 is further connected to the eighteenth binary adder circuit 394 for receiving the eighteenth binary sum. The nineteenth binary adder circuit 396 adds the twenty-fifth intermediate bit and the eighteenth binary sum to generate a nineteenth binary sum. The seventeenth binary adder circuit 392 is also connected to the twentieth binary adder circuit 398 for transmitting the seventeenth binary sum thereto. The twentieth binary adder circuit 398 is further connected to the nineteenth binary adder circuit 396 for receiving the nineteenth binary sum. The twentieth binary adder circuit 398 adds the seventeenth and nineteenth binary sums to generate a twentieth binary sum that is output as the fifth bit of the first product $S_1*S_2$.

In an embodiment of the present invention, the second through sixth polynomial basis multiplier circuits 204-212 are similar to the first polynomial basis multiplier circuit 202.

Figure 4:
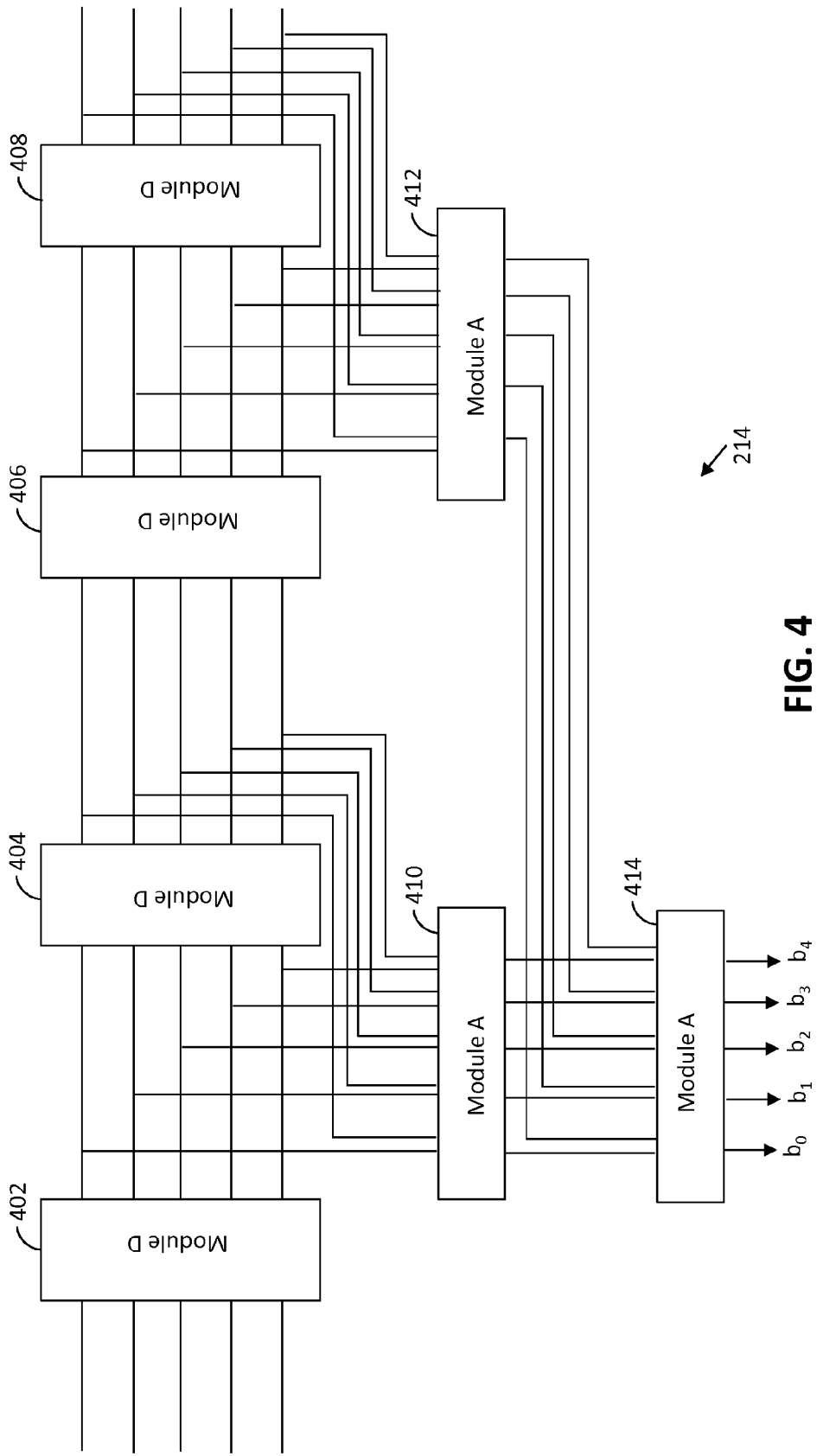
FIG. 4 is a schematic block diagram of a finite field inversion circuit in accordance with an embodiment of the present invention.

Referring now to FIG. 4, a schematic block diagram depicting the first finite field inversion circuit 214 in accordance with an embodiment of the present invention is shown. The first finite field inversion circuit 214 includes first through fourth finite field squaring circuits 402-408, and seventh through ninth polynomial basis multiplier circuits 410-414.

The first through fifth bits of the first syndrome $S_1$ are provided to the first finite field squaring circuit 402. The first finite field squaring circuit 402 generates a first squared output of the first syndrome S1 based on a finite field squaring that is equivalent to squaring the first polynomial that includes the first through fifth bits corresponding to the first through fifth coefficients of the first syndrome $S_1$. The first squared output includes first through fifth bits. In an example, $$S_1 = a_0 + a_1\alpha + a_2\alpha^2 + a_3\alpha^3 + a_4\alpha^4 \qquad (4)$$

$$S_1 * S_1 = (a_0 + a_1\alpha + a_2\alpha^2 + a_3\alpha^3 + a_4\alpha^4)^2 \qquad (5)$$

According to Galois Field ($2^5$) polynomial multiplication, the equation (5) can be resolved to the equation (6) as shown below:

$$S_1^2 = (a_0 + a_4) + a_3\alpha + (a_1 + a_4)\alpha^2 + (a_3 + a_4)\alpha^3 + a_2\alpha^4 \qquad (6)$$

Thus, the first through fifth bits of the first squared output correspond to the coefficients of the terms of the finite variable $\alpha$ in the equation (6), respectively. The first through fifth bits of the first squared output are transmitted to the second finite field squaring circuit 404 and the seventh polynomial basis multiplier circuit 410. The second finite field squaring circuit 404 generates a second squared output by finite field squaring of the first squared output. The second squared output includes first through fifth bits. The first through fifth bits of the second squared output are transmitted to the third finite field squaring circuit 406 and the seventh polynomial basis multiplier circuit 410. The third finite field squaring circuit 406 generates a third squared output by finite field squaring of the second squared output. The third squared output includes first through fifth bits. The first through fifth bits of the third squared output are transmitted to the fourth finite field squaring circuit 408 and the eighth polynomial basis multiplier circuit 412. The fourth finite field squaring circuit 408 generates a fourth squared output by finite field squaring of the third squared output.

The fourth squared output includes first through fifth bits that are transmitted to the eighth polynomial basis multiplier circuit 412. The seventh polynomial basis multiplier circuit 410 multiplies the first and second squared outputs to generate a seventh product that includes first through fifth bits. The first through fifth bits of the seventh product are transmitted to the ninth polynomial basis multiplier circuit 414. Further, the eighth polynomial basis multiplier circuit 412 multiplies the third and fourth squared outputs to generate an eighth product that includes first through fifth bits. The first through fifth bits of the eighth product are transmitted to the ninth polynomial basis multiplier circuit 414. The ninth polynomial basis multiplier circuit 414 multiplies the seventh and eighth products to generate the first inverse $S_1^{-1}$. In an embodiment of the present invention, the second finite field inversion circuit 216 is similar to the first finite field inversion circuit 214.

Figure 5A:
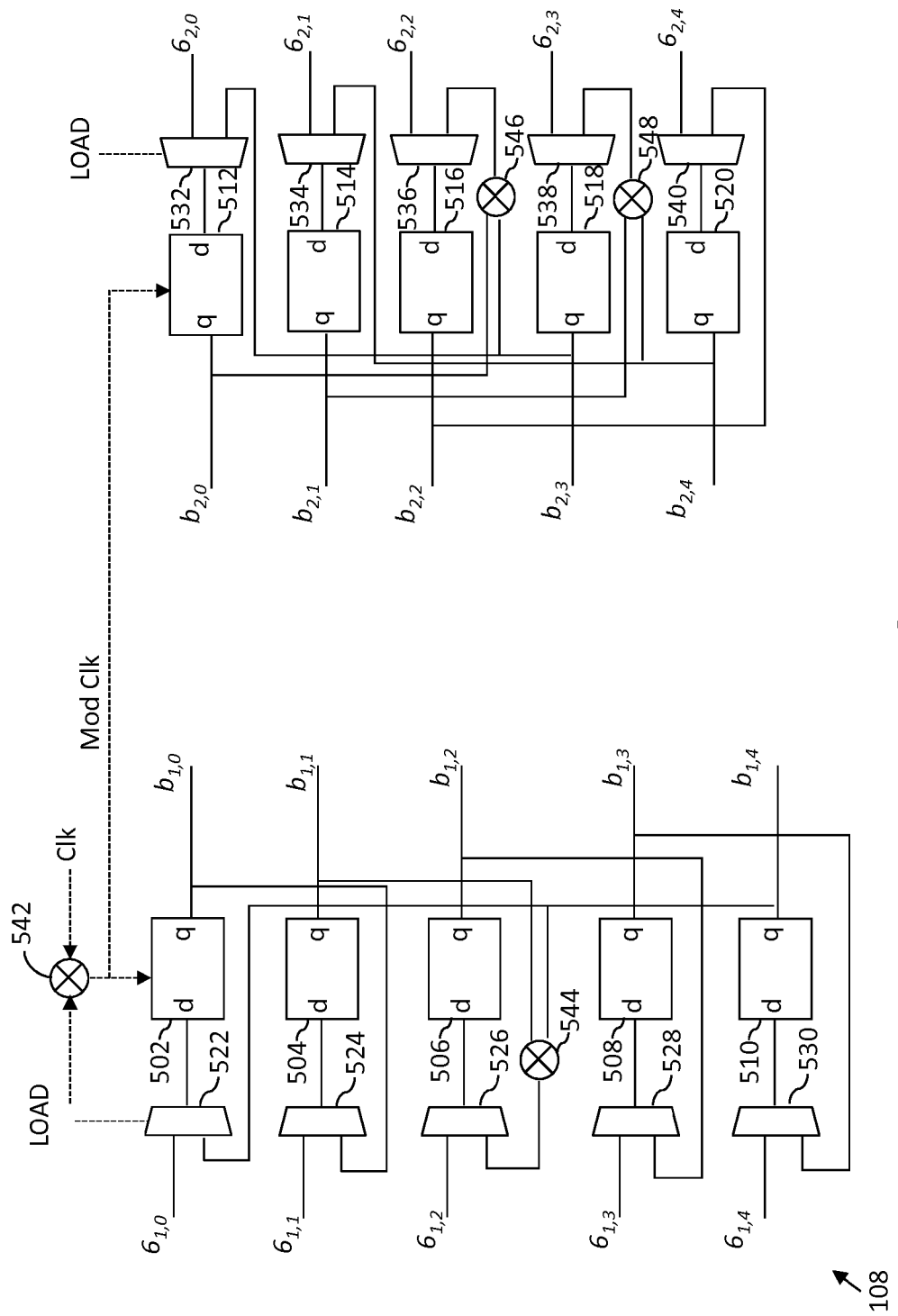
FIGS. 5A, 5B, and 5C are detailed schematic block diagrams of an error bit locator in accordance with an embodiment of the present invention.
Figure 5B:
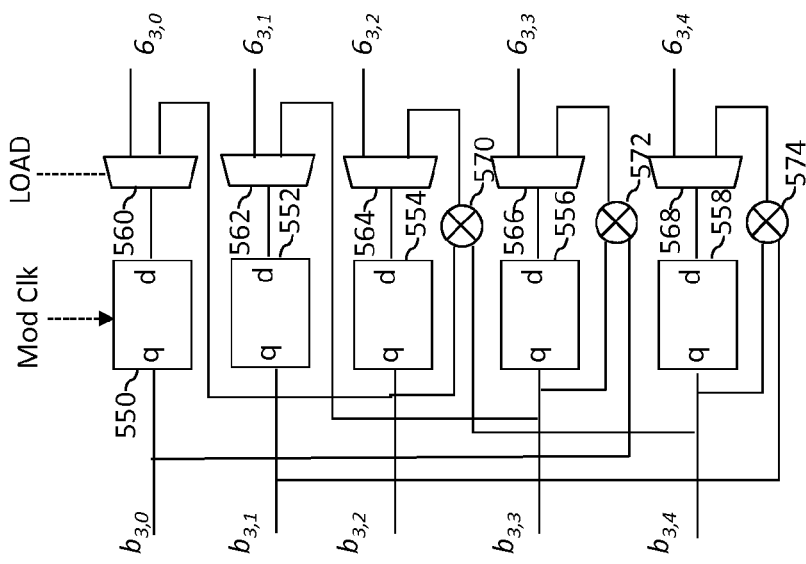
Figure 5C:
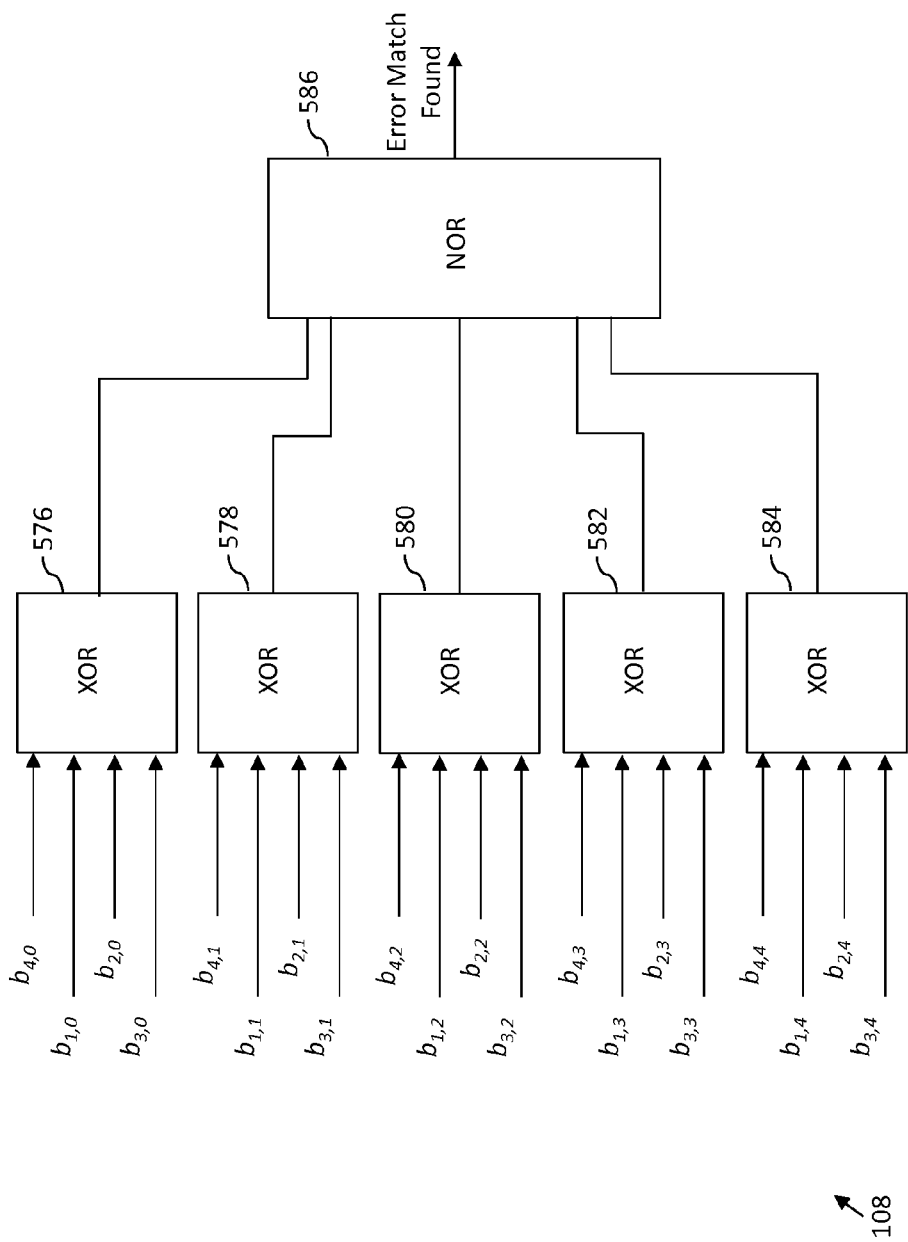

Referring now to FIGS. 5A, 5B and 5C, detailed schematic block diagrams depicting the error bit locator 108 in accordance with an embodiment of the present invention is shown. As shown in FIG. 5A, the error bit locator 108 includes first through tenth flip-flops 502-520, first through tenth multiplexers or muxes 522-540, and second through fifth XOR gates 542-548. As shown in FIG. 5B, the error bit locator 108 further includes eleventh through fifteenth flip-flops 550-558, eleventh through fifteenth muxes 560-568, and sixth through eighth XOR gates 566-570. As shown in FIG. 5C, the error bit locator 108 further includes ninth through thirteenth XOR gates 576-584, and a NOR gate 586.

The first mux 522 receives the first bit of the first coefficient ($6_{1,0}$) associated with the error location polynomial at a first input terminal, a first input signal ($b_{1,4}$) at a second input terminal, and the load signal at a select input signal thereof. An output terminal of the first mux 522 is connected to an input terminal of the first flip-flop 502. The first mux 522 selectively transmits either the first bit of the first coefficient $6_{1,0}$ or the first input signal $b_{1,4}$ by way of the output terminal thereof to the first flip-flop 502. The second XOR gate 542 receives the load signal and the clock signal clk and generates a modified clock signal (mod clk). The modified clock signal mod clk is provided at a clock input terminal of the first flip-flop 502. The first flip-flop 502 generates a second input signal ($b_{1,0}$) at an output terminal thereof.

The second mux 524 receives the second bit of the first coefficient ($6_{1,1}$) associated with the error location polynomial at a first input terminal, the second input signal $b_{1,0}$ at a second input terminal, and the load signal at a select input signal thereof. An output terminal of the second mux 524 is connected to an input terminal of the second flip-flop 504. The second mux 524 selectively transmits either the second bit of the first coefficient $6_{1,1}$ or the second input signal $b_{1,0}$ by way of the output terminal thereof to the second flip-flop 504. The modified clock signal mod clk is provided at a clock input terminal of the second flip-flop 504. The second flip-flop 504 generates a first intermediate input signal ($b_{1,1}$) at an output terminal thereof.

The third mux 526 receives the third bit of the first coefficient ($6_{1,2}$) associated with the error location polynomial at a first input terminal and receives the load signal at a select input signal thereof. A second input terminal of the third mux 526 is connected to the third XOR gate 544 for receiving a third input signal and an output terminal of the third mux 526 is connected to an input terminal of the third flip-flop 506. The third XOR gate 544 receives the first input $b_{1,4}$ and first intermediate input signals $b_{1,1}$ and generates and transmits the third input signal to the third mux 526. The third mux 526 selectively transmits either the third bit of the first coefficient $6_{1,2}$ or the third input signal by way of the output terminal thereof to the third flip-flop 506. The modified clock signal mod clk is provided at a clock input terminal of the third flip-flop 506. The third flip-flop 506 generates a fourth intermediate input signal ($b_{1,2}$) at an output terminal thereof.

The fourth mux 528 receives the fourth bit of the first coefficient ($6_{1,3}$) associated with the error location polynomial at a first input terminal, the fourth intermediate input signal $b_{1,2}$ at a second input terminal, and the load signal at a select input signal thereof. An output terminal of the fourth mux 528 is connected to an input terminal of the fourth flip-flop 508. The fourth mux 528 selectively transmits either the fourth bit of the first coefficient $6_{1,3}$ or the fourth intermediate input signal $b_{1,3}$ by way of the output terminal thereof to the fourth flip-flop 508. The modified clock signal mod clk is provided at a clock input terminal of the fourth flip-flop 508. The fourth flip-flop 508 generates a fifth input signal ($b_{1,3}$) at an output terminal thereof.

The fifth mux 530 receives the fifth bit of the first coefficient ($6_{1,4}$) associated with the error location polynomial at a first input terminal, the fifth input signal $b_{1,3}$ at a second input terminal, and the load signal at a select input signal thereof.

An output terminal of the fifth mux 530 is connected to an input terminal of the fifth flip-flop 510. The fifth mux 530 selectively transmits either the fifth bit of the first coefficient $6_{1,4}$ or the fifth input signal $b_{1,3}$ by way of the output terminal thereof to the fifth flip-flop 510. The modified clock signal mod clk is provided at a clock input terminal of the fifth flip-flop 510. The fifth flip-flop 510 generates the first input signal $b_{1,4}$ at an output terminal thereof. When the load signal transitions to logic high state, i.e., when the set of encoded bits have been received, the first through fifth bits of the first coefficient $6_1$ associated with the error location polynomial are latched onto the first through fifth flip-flops 502-510, respectively, and at subsequent negative edge of the clock signal clk, the first through fifth flip-flops 502-510 generate output signals ($b_{1,0}$-$b_{1,4}$), respectively.

The sixth mux 532 receives the first bit of the second coefficient ($6_{2,0}$) associated with the error location polynomial at a first input terminal, a sixth input signal ($b_{2,3}$) at a second input terminal, and the load signal at a select input signal thereof. An output terminal of the sixth mux 532 is connected to an input terminal of the sixth flip-flop 512. The sixth mux 532 selectively transmits either the first bit of the second coefficient $6_{2,0}$ or the sixth input signal $b_{2,3}$ by way of the output terminal thereof to the sixth flip-flop 512. The modified clock signal mod clk is provided at a clock input terminal of the sixth flip-flop 512. The sixth flip-flop 512 generates a second intermediate input signal ($b_{2,0}$) at an output terminal thereof.

The seventh mux 534 receives the second bit of the second coefficient ($6_{2,1}$) associated with the error location polynomial at a first input terminal, a seventh input signal ($b_{2,4}$) at a second input terminal, and the load signal at a select input signal thereof. An output terminal of the seventh mux 534 is connected to an input terminal of the seventh flip-flop 514. The seventh mux 534 selectively transmits either the second bit of the second coefficient $6_{2,1}$ or the seventh input signal $b_{2,4}$ by way of the output terminal thereof to the seventh flip-flop 514. The modified clock signal mod clk is provided at a clock input terminal of the seventh flip-flop 514. The seventh flip-flop 514 generates a third intermediate input signal ($b_{2,1}$) at an output terminal thereof.

The eighth mux 536 receives the third bit of the second coefficient ($6_{2,2}$) associated with the error location polynomial at a first input terminal and receives the load signal at a select input signal thereof. A second input terminal of the eighth mux 536 is connected to the fourth XOR gate 546 for receiving an eighth input signal and an output terminal of the eighth mux 536 is connected to an input terminal of the eighth flip-flop 516. The fourth XOR gate 546 receives the sixth input $b_{2,3}$ and second intermediate input signals $b_{2,0}$ and generates and transmits the eighth input signal to the eighth mux 536. The eighth mux 536 selectively transmits either the third bit of the second coefficient $6_{2,2}$ or the eighth input signal by way of the output terminal thereof to the eighth flip-flop 516. The modified clock signal mod clk is provided at a clock input terminal of the eighth flip-flop 516. The eighth flip-flop 516 generates a tenth input signal ($b_{2,2}$) at an output terminal thereof.

The ninth mux 538 receives the fourth bit of the second coefficient ($6_{2,3}$) associated with the error location polynomial at a first input terminal and the load signal at a select input signal thereof. A second input terminal of the ninth mux 538 is connected to the fifth XOR gate 548 for receiving a ninth input signal and an output terminal of the ninth mux 538 is connected to an input terminal of the ninth flip-flop 518. The fifth XOR gate 548 receives the seventh input and third intermediate input signals and generates and transmits the ninth input signal to the ninth mux 538. The ninth mux 538 selectively transmits either the fourth bit of the second coefficient $6_{2,3}$ or the ninth input signal $b_{2,3}$ by way of the output terminal thereof to the ninth flip-flop 518. The modified clock signal mod clk is provided at a clock input terminal of the ninth flip-flop 518. The ninth flip-flop 518 generates the ninth input signal $b_{2,3}$ at an output terminal thereof.

The tenth mux 540 receives the fifth bit of the second coefficient ($6_{2,4}$) associated with the error location polynomial at a first input terminal, the tenth input signal at a second input terminal, and the load signal at a select input signal thereof. An output terminal of the tenth mux 540 is connected to an input terminal of the tenth flip-flop 520. The tenth mux 540 selectively transmits either the fifth bit of the second coefficient $6_{2,4}$ or the tenth input signal by way of the output terminal thereof to the tenth flip-flop 520. The modified clock signal is provided at a clock input terminal of the tenth flip-flop 520. The tenth flip-flop 520 generates the seventh input signal $b_{2,4}$ at an output terminal thereof. When the load signal transitions to logic high state, i.e., when the set of encoded bits have been received, the first through fifth bits of the second coefficient $6_2$ associated with the error location polynomial are latched onto the sixth through eleventh flip-flops 512-520, respectively, and at the subsequent negative edge of the clock signal clk, the sixth through eleventh flip-flops 512-520 generate output signals ($b_{2,0}$-$b_{2,4}$), respectively.

The eleventh mux 560 receives the first bit of the third coefficient ($6_{3,0}$) associated with the error location polynomial at a first input terminal, an eleventh input signal at a second input terminal, and the load signal at a select input signal thereof. An output terminal of the eleventh mux 560 is connected to an input terminal of the eleventh flip-flop 550. The eleventh mux 560 selectively transmits either the first bit of the third coefficient $6_{3,0}$ or the eleventh input signal by way of the output terminal thereof to the eleventh flip-flop 550. The modified clock signal mod clk is provided at a clock input terminal of the eleventh flip-flop 550. The eleventh flip-flop 550 generates a fourth intermediate input signal ($b_{3,0}$) at an output terminal thereof.

The twelfth mux 562 receives the second bit of the third coefficient ($6_{3,1}$) associated with the error location polynomial at a first input terminal, a twelfth input signal at a second input terminal, and the load signal at a select input signal thereof. An output terminal of the twelfth mux 562 is connected to an input terminal of the twelfth flip-flop 552. The twelfth mux 562 selectively transmits either the second bit of the third coefficient $6_{3,1}$ or the twelfth input signal by way of the output terminal thereof to the twelfth flip-flop 552. The modified clock signal mod clk is provided at a clock input terminal of the twelfth flip-flop 552. The twelfth flip-flop 552 generates a fifth intermediate input signal ($b_{3,1}$) at an output terminal thereof.

The thirteenth mux 564 receives the third bit of the third coefficient ($6_{3,2}$) associated with the error location polynomial at a first input terminal and the load signal at a select input signal thereof. A second input terminal of the thirteenth mux 564 is connected to the sixth XOR gate 570 for receiving a thirteenth input signal and an output terminal of the thirteenth mux 564 is connected to an input terminal of the thirteenth flip-flop 554. The sixth XOR gate 570 receives the eleventh input signal and a sixth intermediate input signal and generates and transmits the thirteenth input signal to the thirteenth mux 564. The thirteenth mux 564 selectively transmits either the third bit of the third coefficient $6_{3,2}$ or the thirteenth input signal by way of the output terminal thereof to the thirteenth flip-flop 554. The modified clock signal mod clk is provided at a clock input terminal of the thirteenth flip-flop 554. The thirteenth flip-flop 554 generates the eleventh input signal $b_{3,2}$ at an output terminal thereof.

The fourteenth mux 566 receives the fourth bit of the third coefficient ($6_{3,3}$) associated with the error location polynomial at a first input terminal and the load signal at a select input signal thereof. A second input terminal of the fourteenth mux 566 is connected to the seventh XOR gate 572 for receiving a fourteenth input signal and an output terminal of the fourteenth mux 566 is connected to an input terminal of the fourteenth flip-flop 556. The seventh XOR gate 572 receives the twelfth input and fourth intermediate input signals and generates and transmits the fourteenth input signal to the fourteenth mux 556. The fourteenth mux 556 selectively transmits either the fourth bit of the third coefficient $6_{3,3}$ or the fourteenth input signal $b_{3,3}$ by way of the output terminal thereof to the fourteenth mux 556. The modified clock signal mod clk is provided at a clock input terminal of the fourteenth mux 556. The fourteenth mux 556 generates the twelfth input signal $b_{3,3}$ at an output terminal thereof.

The fifteenth mux 568 receives the fifth bit of the third coefficient ($6_{3,4}$) associated with the error location polynomial at a first input terminal and the load signal at a select input signal thereof. A second input terminal of the fifteenth mux 568 is connected to the eighth XOR gate 574 for receiving a fifteenth input signal and an output terminal of the fifteenth mux 568 is connected to an input terminal of the fifteenth flip-flop 558. The eighth XOR gate 574 receives the fifth and sixth intermediate input signals and generates and transmits the fifteenth input signal to the fifteenth mux 558. The fifteenth mux 558 selectively transmits either the fifth bit of the third coefficient $6_{3,4}$ or the fifteenth input signal by way of the output terminal thereof to the fifteenth mux 558. The modified clock signal mod clk is provided at a clock input terminal of the fifteenth mux 558. The fifteenth mux 558 generates the sixth intermediate input signal $b_{3,4}$ at an output terminal thereof.

A first bit of the fourth coefficient $6_4$ (that is equal to binary zero) associated with the error location polynomial, the second input signal $b_{1,0}$, the second intermediate input signal $b_{2,0}$, and the fourth intermediate input signal $b_{3,0}$ are provided to the ninth XOR gate 576. The ninth XOR gate 576 generates a first intermediate error bit. A second bit of the fourth coefficient $6_4$ (that is equal to binary zero) associated with the error location polynomial, the first intermediate input signal $b_{1,1}$, the third intermediate input signal $b_{2,1}$, and the fifth intermediate input signal $b_{3,1}$ are provided to the tenth XOR gate 578. The tenth XOR gate 578 generates a second intermediate error bit. A third bit of the fourth coefficient $6_4$ (that is equal to binary zero) associated with the error location polynomial, the fourth input signal $b_{1,2}$, the tenth input signal $b_{2,2}$, and the eleventh input signal $b_{3,2}$ are provided to the eleventh XOR gate 580. The eleventh XOR gate 580 generates a third intermediate error bit.

A fourth bit of the fourth coefficient $6_4$ (that is equal to binary zero) associated with the error location polynomial, the fifth input signal $b_{1,3}$, the sixth input signal $b_{2,3}$, and the twelfth input signal $b_{3,3}$ are provided to the twelfth XOR gate 582. The twelfth XOR gate 582 generates a fourth intermediate error bit. A fifth bit of the fourth coefficient $6_4$ (that is equal to binary one) associated with the error location polynomial, the first input signal $b_{1,4}$, the seventh input signal $b_{2,4}$, and the sixth intermediate input signal $b_{3,4}$ are provided to the thirteenth XOR gate 584. The thirteenth XOR gate 584 generates a fifth intermediate error bit. The first through fifth intermediate bits are transmitted to the NOR gate 586. The NOR gate 586 receives the first through fifth intermediate bits and generates the error match bit. When the load signal transitions to logic high state, i.e., when the set of encoded bits have been received, the first through fifth bits of the third coefficient $6_3$ associated with the error location polynomial are latched on to the eleventh through fifteenth flip-flops 550-558, respectively, and at the subsequent negative edge of the clock signal clk, the eleventh through fifteenth flip-flops 550-558 generate output signals ($b_{3,0}$-$b_{3,4}$), respectively.

While various embodiments of the present invention have been illustrated and described, it will be clear that the present invention is not limited to these embodiments only. Numerous modifications, changes, variations, substitutions, and equivalents will be apparent to those skilled in the art, without departing from The spirit and scope of the present invention, as described in the claims.

The invention claimed is:

1. A decoder, comprising:
   a syndrome generator for receiving a set of encoded bits and generating a corresponding set of syndromes based on a clock signal;
   a key equation solver, connected to the syndrome generator, for determining an error location polynomial using the set of syndromes, wherein the key equation solver determines first through fourth coefficients of the error location polynomial, and wherein each of the first through fourth coefficients include first through fifth bits, wherein the key equation solver comprises:
      a first polynomial basis multiplier circuit for determining a first product that is a product of first and second syndromes;
      a first finite field inversion circuit for determining a first inverse that is a multiplicative inverse of the first syndrome;
      a first finite field adder circuit, connected to the first polynomial basis multiplier circuit, for determining a first finite field sum that is a sum of the first product and a third syndrome;
      a second finite field inversion circuit connected to the first adder circuit, for determining a second inverse that is a multiplicative inverse of the first sum;
      a second polynomial basis multiplier circuit, connected to the first adder circuit and the first inversion circuit, for determining a second product that is a product of the first sum and the first inverse;
      a third polynomial basis multiplier circuit, connected to the second polynomial basis multiplier circuit, for determining a third product that is a product of the second product and the third syndrome;
      a fourth polynomial basis multiplier circuit for determining a fourth product that is a product of the first syndrome and a fourth syndrome;
      a second finite field adder circuit, connected to the fourth polynomial basis multiplier circuit, for determining a second finite field sum that is a sum of the fourth product and a fifth syndrome;
      a third finite field adder circuit, connected to the second finite field adder circuit and the third polynomial basis multiplier circuit, for determining a third finite field sum that is a sum of the third product and the second finite field sum;
      a fifth polynomial basis multiplier circuit, connected to the third finite field adder circuit and the second finite field inversion circuit, for determining a fifth product that is a product of the third finite field sum and the second finite field inverse;
      a fourth finite field adder circuit, connected to the second and fifth polynomial basis multiplier circuits, for determining a fourth finite field sum that is a sum of the second and fifth products; and a sixth polynomial basis multiplier circuit, connected to the fifth polynomial basis multiplier circuit, for determining a sixth product that is a product of the fifth product and the first syndrome, wherein the first coefficient is the first syndrome, the second coefficient is the fourth finite field sum, the third coefficient is the sixth product, and the fourth coefficient is binary one;

a serial bit register for receiving the set of encoded bits and outputting an encoded bit at each active edge of the clock signal;

an error bit locator, connected to the key equation solver, for identifying an erroneous encoded bit by generating an error match bit based on the first through fourth coefficients of the error location polynomial; and a first XOR gate, connected to the serial bit register and the error bit locator, for generating a decoded bit based on the encoded bit and the error match bit.

2. The decoder of claim 1, wherein the first polynomial basis multiplier circuit comprises:

a first finite field multiplier circuit for generating a first intermediate product having first through fifth bits corresponding to the first syndrome, based on a finite field multiplication of a first polynomial that includes first through fifth coefficients that are equal to first through fifth bits of the first syndrome, respectively, and a finite field variable, wherein the first polynomial includes one or more terms of the finite field variable;

a second finite field multiplier circuit, connected to the first finite field multiplier circuit, for generating a second intermediate product having first through fifth bits corresponding to the first intermediate product based on the finite field multiplication of a second polynomial that includes first through fifth coefficients that are equal to the first through fifth bits of the first intermediate product, respectively, and the finite field variable, and wherein the second intermediate product includes first through fifth bits;

a third finite field multiplier circuit, connected to the second finite field multiplier circuit, for generating a third intermediate product having first through fifth bits corresponding to the second intermediate product based on the finite field multiplication of a third polynomial that includes first through fifth coefficients that are equal to the first through fifth bits of the second intermediate product, respectively, and the finite field variable, and wherein the third intermediate product includes first through fifth bits;

a fourth finite field multiplier circuit, connected to the third finite field multiplier circuit, for generating a fourth intermediate product having first through fifth bits corresponding to the third intermediate product based on the finite field multiplication of a fourth polynomial including first through fifth coefficients that are equal to the first through fifth bits of the third intermediate product, respectively, and the finite field variable, and wherein the fourth intermediate product includes first through fifth bits;

a first logic circuit for receiving the first through fifth bits of the first syndrome, a first bit of the second syndrome, and the first bit of the first through fourth intermediate products, wherein the first logic circuit determines a fourth binary sum;

a second logic circuit for receiving the first through fifth bits of the first syndrome, a second bit of the second syndrome, and the second bit of the first through fourth intermediate products, wherein the second logic circuit determines an eighth binary sum;

a third logic circuit for receiving the first through fifth bits of the first syndrome, a third bit of the second syndrome, and the third bit of the first through fourth intermediate products, wherein the third logic circuit determines a twelfth binary sum;

a fourth logic circuit for receiving the first through fifth bits of the first syndrome, a fourth bit of the second syndrome, and the fourth bit of the first through fourth intermediate products, wherein the fourth logic circuit determines a sixteenth binary sum; and a fifth logic circuit for receiving the first through fifth bits of the first syndrome, a fifth bit of the second syndrome, and the fifth bit of the first through fourth intermediate products, wherein the fifth logic circuit determines a twentieth binary sum.

3. The decoder of claim 2, wherein the first logic circuit includes:

a first set of AND gates including first through fifth AND gates, wherein the first AND gate receives the first bit of the first syndrome and the first bit of the second syndrome, and wherein the second through fifth AND gates receive the first bit of the first through fourth intermediate products and the second through fifth bits of the first syndrome, respectively, and wherein the first through fifth AND gates generate first through fifth intermediate bits, respectively;

a first binary adder circuit, connected to the first and second AND gates, for determining a first binary sum that is a sum of the first and second intermediate bits;

a second binary adder circuit, connected to the third and fourth AND gates, for determining a second binary sum that is a sum of the third and fourth intermediate bits;

a third binary adder circuit, connected to the fifth AND gate and the second binary adder circuit, for determining a third binary sum that is a sum of the fifth intermediate bit and the second binary sum; and a fourth binary adder circuit, connected to the first and third binary adder circuits, for determining the fourth binary sum that is a sum of the first and third binary sums.

4. The decoder of claim 3, wherein the second logic circuit includes:

a second set of AND gates including sixth through tenth AND gates, wherein the sixth AND gate receives the first bit of the first syndrome and the second bit of the second syndrome, and wherein the seventh through tenth AND gates receive the second bit of the first through fourth intermediate products and the second through fifth bits of the first syndrome, respectively, and wherein the sixth through tenth AND gates generate sixth through tenth intermediate bits, respectively;

a fifth binary adder circuit, connected to the sixth and seventh AND gates, for determining a fifth binary sum that is a sum of the sixth and seventh intermediate bits;

a sixth binary adder circuit, connected to the eighth and ninth AND gates, for determining a sixth binary sum that is a sum of the eighth and ninth intermediate bits;

a seventh binary adder circuit, connected to the tenth AND gate and the sixth binary adder circuit, for determining a seventh binary sum that is a sum of the tenth intermediate bit and the sixth binary sum; and an eighth binary adder circuit, connected to the fifth and seventh binary adder circuits, for determining the eighth binary sum that is a sum of the fifth and seventh binary sums.

5. The decoder of claim 4, wherein the third logic circuit includes:
- a third set of AND gates including eleventh through fifteenth AND gates, wherein the eleventh AND gate receives the first bit of the first syndrome and the third bit of the second syndrome, and wherein the twelfth through fifteenth AND gates receive the third bit of the first through fourth intermediate products and the second through fifth bits of the first syndrome, respectively, and wherein the eleventh through fifteenth AND gates generate eleventh through fifteenth intermediate bits, respectively;
- a ninth binary adder circuit, connected to the eleventh and twelfth AND gates, for determining a ninth binary sum that is a sum of the eleventh and twelfth intermediate bits;
- a tenth binary adder circuit, connected to the thirteenth and fourteenth AND gates, for determining a tenth binary sum that is a sum of the thirteenth and fourteenth intermediate bits;
- an eleventh binary adder circuit, connected to the fifteenth AND gate and the tenth binary adder circuit, for determining an eleventh binary sum that is a sum of the fifteenth intermediate bit and the tenth binary sum; and
- a twelfth binary adder circuit, connected to the ninth and eleventh binary adder circuits, for determining the twelfth binary sum that is a sum of the ninth and eleventh binary sums.

6. The decoder of claim 5, wherein the fourth logic circuit includes:
- a fourth set of AND gates including sixteenth through twentieth AND gates, wherein the sixteenth AND gate receives the first bit of the first syndrome and the fourth bit of the second syndrome, and wherein the seventeenth through twentieth AND gates receive the fourth bit of the first through fourth intermediate products and the second through fifth bits of the first syndrome, respectively, and wherein the sixteenth through twentieth AND gates generate sixteenth through twentieth intermediate bits, respectively;
- a thirteenth binary adder circuit, connected to the sixteenth and seventeenth AND gates, for determining a thirteenth binary sum that is a sum of the sixteenth and seventeenth intermediate bits;
- a fourteenth binary adder circuit, connected to the eighteenth and nineteenth AND gates, for determining a fourteenth binary sum that is a sum of the eighteenth and nineteenth intermediate bits;
- a fifteenth binary adder circuit, connected to the twentieth AND gate and the fourteenth binary adder circuit, for determining a fifteenth binary sum that is a sum of the twentieth intermediate bit and the fourteenth binary sum; and
- a sixteenth binary adder circuit, connected to the thirteenth and fifteenth binary adder circuits, for determining the sixteenth binary sum that is a sum of the thirteenth and fifteenth binary sums.

7. The decoder of claim 6, wherein the fifth logic circuit includes:
- a fifth set of AND gates including twenty-first through twenty-fifth AND gates, wherein the twenty-first AND gate receives the first bit of the first syndrome and the fifth bit of the second syndrome, and wherein the twenty-second through twenty-fifth AND gates receive the fifth bit of the first through fourth intermediate products and the second through fifth bits of the first syndrome, respectively, and wherein the twenty-first through twenty-fifth AND gates generate twenty-first through twenty-fifth intermediate bits, respectively;
- a seventeenth binary adder circuit, connected to the twenty-first and twenty-second AND gates, for determining a seventeenth binary sum that is a sum of the twenty-first and twenty-second intermediate bits;
- an eighteenth binary adder circuit, connected to the twenty-third and twenty-fourth AND gates, for determining an eighteenth binary sum that is a sum of the twenty-third and twenty-fourth intermediate bits;
- a nineteenth binary adder circuit, connected to the twenty-fifth AND gate and the eighteenth binary adder circuit, for determining a nineteenth binary sum that is a sum of the twenty-fifth intermediate bit and the nineteenth binary sum; and
- a twentieth binary adder circuit, connected to the seventeenth and nineteenth binary adder circuits, for determining the twentieth binary sum that is a sum of the seventeenth and nineteenth binary sums.

8. The decoder of claim 7, wherein the first finite field inversion circuit comprises:
- a first finite field squaring circuit for generating a first squared output corresponding to the first syndrome based on a finite field squaring of the first polynomial, wherein the first squared output includes first through fifth bits;
- a second finite field squaring circuit for generating a second squared output based on the finite field squaring of the first squared output, wherein the second squared output includes first through fifth bits;
- a third finite field squaring circuit for generating a third squared output based on the finite field squaring of the second squared output, wherein the third squared output includes first through fifth bits;
- a fourth finite field squaring circuit for generating a fourth squared output based on the finite field squaring of the third squared output, wherein the fourth squared output includes first through fifth bits;
- a seventh polynomial basis multiplier circuit, connected to the first and second finite field squaring circuits, for receiving the first through fifth bits of the first and second squared outputs, respectively, wherein the seventh polynomial basis multiplier circuit determines a seventh product that is a product of the first and second squared outputs, and wherein the seventh product includes first through fifth bits;
- an eighth polynomial basis multiplier circuit, connected to the third and fourth finite field squaring circuits, for receiving the first through fifth bits of the third and fourth squared outputs, respectively, wherein the eighth polynomial basis multiplier circuit determines an eighth product that is a product of the third and fourth squared outputs, and wherein the eighth product includes first through fifth bits; and
- a ninth polynomial basis multiplier circuit, connected to the seventh and eighth polynomial basis multiplier circuits, for receiving the first through fifth bits of the seventh and eighth products, wherein the ninth polynomial basis multiplier circuit determines the first inverse that is a product of the eighth and ninth products.

9. The decoder of claim 8, wherein the error bit locator comprises:
- a second XOR gate for receiving a load signal and the clock signal and generating a modified clock signal;
- a first multiplexer having a first input terminal for receiving the first bit of the first coefficient associated with the error location polynomial, a second input terminal for receiving a first input signal, a select input terminal for receiving the load signal, wherein the first multiplexer selectively provides at least one of the first bit of the first coefficient and the first input signal at an output terminal thereof;

a first flip-flop having an input terminal connected to the output terminal of the first multiplexer for receiving at least one of the first input signal and the first bit of the first coefficient, a clock input terminal for receiving the modified clock signal, wherein the first flip-flop generates a second input signal at an output terminal thereof;

a second multiplexer having a first input terminal for receiving the second bit of the first coefficient associated with the error location polynomial, a second input terminal for receiving the second input signal, a select input terminal for receiving the load signal, wherein the second multiplexer selectively provides at least one of the second bit of the first coefficient and the second input signal at an output terminal thereof;

a second flip-flop having an input terminal connected to the output terminal of the second multiplexer for receiving at least one of the second input signal and the second bit of the first coefficient, a clock input terminal for receiving the modified clock signal, wherein the second flip-flop generates a first intermediate input signal at an output terminal thereof;

a third multiplexer having a first input terminal for receiving the third bit of the first coefficient associated with the error location polynomial, a second input terminal for receiving a third input signal, a select input terminal for receiving the load signal, wherein the third multiplexer selectively provides at least one of the third bit of the first coefficient and the third input signal at an output terminal thereof;

a third XOR gate, connected to the second flip-flop and the third multiplexer, wherein the third XOR gate receives the first input and first intermediate input signals and generates and transmits the third input signal to the third multiplexer;

a third flip-flop having an input terminal connected to the output terminal of the third multiplexer for receiving at least one of the third input signal and the third bit of the first coefficient, a clock input terminal for receiving the modified clock signal, wherein the third flip-flop generates a fourth input signal at an output terminal thereof;

a fourth multiplexer having a first input terminal for receiving the fourth bit of the first coefficient associated with the error location polynomial, a second input terminal for receiving the fourth input signal, a select input terminal for receiving the load signal, wherein the fourth multiplexer selectively provides at least one of the fourth bit of the first coefficient and the fourth input signal at an output terminal thereof;

a fourth flip-flop having an input terminal connected to the output terminal of the fourth multiplexer for receiving at least one of the fourth input signal and the fourth bit of the first coefficient, a clock input terminal for receiving the modified clock signal, wherein the fourth flip-flop generates a fifth input signal at an output terminal thereof;

a fifth multiplexer having a first input terminal for receiving the fifth bit of the first coefficient associated with the error location polynomial, a second input terminal for receiving the fifth input signal, a select input terminal for receiving the load signal, wherein the fifth multiplexer selectively provides at least one of the fifth bit of the first coefficient and the fifth input signal at an output terminal thereof; and a fifth flip-flop having an input terminal connected to the output terminal of the fifth multiplexer for receiving at least one of the fifth input signal and the fifth bit of the first coefficient, a clock input terminal for receiving the modified clock signal, wherein the fifth flip-flop generates the first input signal at an output terminal thereof.

10. The decoder of claim 9, wherein the error bit locator further comprises:

a sixth multiplexer having a first input terminal for receiving the first bit of the second coefficient associated with the error location polynomial, a second input terminal for receiving a sixth input signal, a select input terminal for receiving the load signal, wherein the sixth multiplexer selectively provides at least one of the first bit of the second coefficient and the sixth input signal at an output terminal thereof;

a sixth flip-flop having an input terminal connected to the output terminal of the sixth multiplexer for receiving at least one of the sixth input signal and the first bit of the second coefficient, a clock input terminal for receiving the modified clock signal, wherein the sixth flip-flop generates a second intermediate input signal at an output terminal thereof;

a seventh multiplexer having a first input terminal for receiving the second bit of the second coefficient associated with the error location polynomial, a second input terminal for receiving a seventh input signal, a select input terminal for receiving the load signal, wherein the seventh multiplexer selectively provides at least one of the second bit of the second coefficient and the seventh input signal at an output terminal thereof;

a seventh flip-flop having an input terminal connected to the output terminal of the seventh multiplexer for receiving at least one of the seventh input signal and the second bit of the second coefficient, a clock input terminal for receiving the modified clock signal, wherein the seventh flip-flop generates a third intermediate input signal at an output terminal thereof;

an eighth multiplexer having a first input terminal for receiving the third bit of the second coefficient associated with the error location polynomial, a second input terminal for receiving an eighth input signal, a select input terminal for receiving the load signal, wherein the eighth multiplexer selectively provides at least one of the third bit of the third coefficient and the seventh input signal at an output terminal thereof;

an eighth flip-flop having an input terminal connected to the output terminal of the eighth multiplexer for receiving at least one of the eighth input signal and the third bit of the second coefficient, a clock input terminal for receiving the modified clock signal, wherein the eighth flip-flop generates a tenth input signal at an output terminal thereof;

a fourth XOR gate connected to the sixth flip-flop and the eighth multiplexer, wherein the fourth XOR gate receives the sixth input and second intermediate input signals and generates and transmits the eighth input signal to the eighth multiplexer;

a ninth multiplexer having a first input terminal for receiving the fourth bit of the second coefficient associated with the error location polynomial, a second input terminal for receiving a ninth input signal, a select input terminal for receiving the load signal, wherein the ninth multiplexer selectively provides at least one of the fourth bit of the second coefficient and the ninth input signal at an output terminal thereof;

a ninth flip-flop having an input terminal connected to the output terminal of the ninth multiplexer for receiving at least one of the ninth input signal and the fourth bit of the second coefficient, a clock input terminal for receiving the modified clock signal, wherein the ninth flip-flop generates the sixth input signal at an output terminal thereof;

a fifth XOR gate connected to the seventh flip-flop and the ninth multiplexer, wherein the fifth XOR gate receives the seventh input and third intermediate input signals and generates and transmits the ninth input signal to the ninth multiplexer;

a tenth multiplexer having a first input terminal for receiving the fifth bit of the second coefficient associated with the error location polynomial, a second input terminal for receiving the tenth input signal, a select input terminal for receiving the load signal, wherein the tenth multiplexer selectively provides at least one of the fifth bit of the second coefficient and the tenth input signal at an output terminal thereof; and a tenth flip-flop having an input terminal connected to the output terminal of the tenth multiplexer for receiving at least one of the tenth input signal and the fifth bit of the second coefficient, a clock input terminal for receiving the modified clock signal, wherein the tenth flip-flop generates the seventh input signal at an output terminal thereof.

11. The decoder of claim 10, wherein the error bit locator further comprises:

an eleventh multiplexer having a first input terminal for receiving the first bit of the third coefficient associated with the error location polynomial, a second input terminal for receiving an eleventh input signal, a select input terminal for receiving the load signal, wherein the eleventh multiplexer selectively provides at least one of the first bit of the third coefficient and the eleventh input signal at an output terminal thereof;

an eleventh flip-flop having an input terminal connected to the output terminal of the eleventh multiplexer for receiving at least one of the eleventh input signal and the first bit of the third coefficient, a clock input terminal for receiving the modified clock signal, wherein the eleventh flip-flop generates a fourth intermediate input signal at an output terminal thereof;

a twelfth multiplexer having a first input terminal for receiving the second bit of the third coefficient associated with the error location polynomial, a second input terminal for receiving a twelfth input signal, a select input terminal for receiving the load signal, wherein the twelfth multiplexer selectively provides at least one of the second bit of the third coefficient and the twelfth input signal at an output terminal thereof;

a twelfth flip-flop having an input terminal connected to the output terminal of the twelfth multiplexer for receiving at least one of the twelfth input signal and the second bit of the third coefficient, a clock input terminal for receiving the modified clock signal, wherein the twelfth flip-flop generates a fifth intermediate input signal at an output terminal thereof;

a thirteenth multiplexer having a first input terminal for receiving the third bit of the third coefficient associated with the error location polynomial, a second input terminal for receiving a thirteenth input signal, a select input terminal for receiving the load signal, wherein the thirteenth multiplexer selectively provides at least one of the third bit of the third coefficient and the thirteenth input signal at an output terminal thereof;

a thirteenth flip-flop having an input terminal connected to the output terminal of the thirteenth multiplexer for receiving at least one of the thirteenth input signal and the third bit of the third coefficient, a clock input terminal for receiving the modified clock signal, wherein the thirteenth flip-flop generates the eleventh input signal at an output terminal thereof;

a sixth XOR gate connected to the thirteenth flip-flop and the thirteenth multiplexer, wherein the sixth XOR gate receives the eleventh input signal and a sixth intermediate input signal and generates and transmits the thirteenth input signal to the thirteenth multiplexer;

a fourteenth multiplexer having a first input terminal for receiving the fourth bit of the third coefficient associated with the error location polynomial, a second input terminal for receiving a fourteenth input signal, a select input terminal for receiving the load signal, wherein the fourteenth multiplexer selectively provides at least one of the fourth bit of the third coefficient and the fourteenth input signal at an output terminal thereof;

a fourteenth flip-flop having an input terminal connected to the output terminal of the fourteenth multiplexer for receiving at least one of the fourteenth input signal and the fourth bit of the third coefficient, a clock input terminal for receiving the modified clock signal, wherein the fourteenth flip-flop generates the twelfth input signal at an output terminal thereof;

a seventh XOR gate connected to the fourteenth flip-flop and the fourteenth multiplexer, wherein the seventh XOR gate receives the twelfth input and fourth intermediate input signals and generates and transmits the fourteenth input signal to the fourteenth multiplexer;

a fifteenth multiplexer having a first input terminal for receiving the fifth bit of the third coefficient associated with the error location polynomial, a second input terminal for receiving a fifteenth input signal, a select input terminal for receiving the load signal, wherein the fifteenth multiplexer selectively provides at least one of the fifth bit of the third coefficient and the fifteenth input signal at an output terminal thereof;

a fifteenth flip-flop having an input terminal connected to the output terminal of the fifteenth multiplexer for receiving at least one of the fifteenth input signal and the fifth bit of the third coefficient, a clock input terminal for receiving the modified clock signal, wherein the fifteenth flip-flop generates the sixth intermediate input signal at an output terminal thereof; and an eighth XOR gate connected to the fifteenth and twelfth flip-flops, and the fifteenth multiplexer, wherein the eighth XOR gate receives the fifth and sixth intermediate input signals and generates and transmits the fifteenth input signal to the fifteenth multiplexer.

12. The decoder of claim 11, wherein the error bit locator further comprises:

a ninth XOR gate for receiving the first bit of the fourth coefficient associated with the error location polynomial and output signals generated by the first, sixth, and eleventh flip-flops, respectively, and generating a first intermediate error bit;

a tenth XOR gate for receiving the second bit of the fourth coefficient associated with the error location polynomial and output signals generated by the second, seventh, and twelfth flip-flops, respectively, and generating a second intermediate error bit;

an eleventh XOR gate for receiving the third bit of the fourth coefficient associated with the error location polynomial and output signals generated by the third, eighth, and thirteenth flip-flops, respectively, and generating a third intermediate error bit;

a twelfth XOR gate for receiving the fourth bit of the fourth coefficient associated with the error location polynomial and output signals generated by the fourth, ninth, and fourteenth flip-flops, respectively, and generating a fourth intermediate error bit;

a thirteenth XOR gate for receiving the fifth bit of the fourth coefficient associated with the error location polynomial and output signals generated by the fifth, tenth, and fifteenth flip-flops, respectively, and generating a fifth intermediate error bit; and a NOR gate for receiving the first through fifth intermediate error bits and generating the error match bit.

13. The decoder of claim 12, wherein the set of encoded bits are encoded using Bose-Chaudhuri-Hocquenghem (BCH) error correcting code.

14. A memory device, comprising:

a Bose-Chaudhuri-Hocquenghem (BCH) decoder for rectifying soft errors in the memory device, the BDH decoder comprising:

a syndrome generator for receiving a set of encoded bits and generating a corresponding set of syndromes based on a clock signal;

a key equation solver, connected to the syndrome generator, for determining an error location polynomial using the set of syndromes, wherein the key equation solver determines first through fourth coefficients of the error location polynomial, and wherein each of the first through fourth coefficients include first through fifth bits, wherein the key equation solver comprises:

a first polynomial basis multiplier circuit for determining a first product that is a product of first and second syndromes;

a first finite field inversion circuit for determining a first inverse that is a multiplicative inverse of the first syndrome;

a first finite field adder circuit, connected to the first polynomial basis multiplier circuit, for determining a first finite field sum that is a sum of the first product and a third syndrome;

a second finite field inversion circuit connected to the first adder circuit, for determining a second inverse that is a multiplicative inverse of the first sum;

a second polynomial basis multiplier circuit, connected to the first adder circuit and the first inversion circuit, for determining a second product that is a product of the first sum and the first inverse;

a third polynomial basis multiplier circuit, connected to the second polynomial basis multiplier circuit, for determining a third product that is a product of the second product and the third syndrome;

a fourth polynomial basis multiplier circuit for determining a fourth product that is a product of the first syndrome and a fourth syndrome;

a second finite field adder circuit, connected to the fourth polynomial basis multiplier circuit, for determining a second finite field sum that is a sum of the fourth product and a fifth syndrome;

a third finite field adder circuit, connected to the second finite field adder circuit and the third polynomial basis multiplier circuit, for determining a third finite field sum that is a sum of the third product and the second finite field sum;

a fifth polynomial basis multiplier circuit, connected to the third finite field adder circuit and the second finite field inversion circuit, for determining a fifth product that is a product of the third finite field sum and the second finite field inverse;

a fourth finite field adder circuit, connected to the second and fifth polynomial basis multiplier circuits, for determining a fourth finite field sum that is a sum of the second and fifth products; and a sixth polynomial basis multiplier circuit, connected to the fifth polynomial basis multiplier circuit, for determining a sixth product that is a product of the fifth product and the first syndrome, wherein the first coefficient is the first syndrome, the second coefficient is the fourth finite field sum, the third coefficient is the sixth product, and the fourth coefficient is binary one;

a serial bit register for receiving the set of encoded bits and outputting an encoded bit at each active edge of the clock signal;

an error bit locator, connected to the key equation solver, for identifying an erroneous encoded bit by generating an error match bit based on the first through fourth coefficients of the error location polynomial; and a first XOR gate, connected to the serial bit register and the error bit locator, for generating a decoded bit based on the encoded bit and the error match bit.

15. The memory device of claim 14, wherein the first polynomial basis multiplier circuit comprises:

a first finite field multiplier circuit for generating a first intermediate product having first through fifth bits corresponding to the first syndrome, based on a finite field multiplication of a first polynomial that includes first through fifth coefficients that are equal to first through fifth bits of the first syndrome, respectively, and a finite field variable, wherein the first polynomial includes one or more terms of the finite field variable;

a second finite field multiplier circuit, connected to the first finite field multiplier circuit, for generating a second intermediate product having first through fifth bits corresponding to the first intermediate product based on the finite field multiplication of a second polynomial that includes first through fifth coefficients that are equal to the first through fifth bits of the first intermediate product, respectively, and the finite field variable;

a third finite field multiplier circuit, connected to the second finite field multiplier circuit, for generating a third intermediate product having first through fifth bits corresponding to the second intermediate product based on the finite field multiplication of a third polynomial that includes first through fifth coefficients that are equal to the first through fifth bits of the second intermediate product, respectively, and the finite field variable;

a fourth finite field multiplier circuit, connected to the third finite field multiplier circuit, for generating a fourth intermediate product having first through fifth bits corresponding to the third intermediate product based on the finite field multiplication of a fourth polynomial including first through fifth coefficients that are equal to the first through fifth bits of the third intermediate product, respectively, and the finite field variable;

a first set of AND gates including first through fifth AND gates, wherein the first AND gate receives the first bit of the first syndrome and a first bit of the second syndrome, and wherein the second through fifth AND gates receive the first bit of the first through fourth intermediate products and the second through fifth bits of the first syndrome, respectively, and wherein the first through fifth AND gates generate first through fifth intermediate bits, respectively;

a first binary adder circuit, connected to the first and second AND gates, for determining a first binary sum that is a sum of the first and second intermediate bits;

a second binary adder circuit, connected to the third and fourth AND gates, for determining a second binary sum that is a sum of the third and fourth intermediate bits;

a third binary adder circuit, connected to the fifth AND gate and the second binary adder circuit, for determining a third binary sum that is a sum of the fifth intermediate bit and the second binary sum;

a fourth binary adder circuit, connected to the first and third binary adder circuits, for determining a fourth binary sum that is a sum of the first and third binary sums;

a second set of AND gates including sixth through tenth AND gates, wherein the sixth AND gate receives the first bit of the first syndrome and a second bit of the second syndrome, and wherein the seventh through tenth AND gates receive the second bit of the first through fourth intermediate products and the second through fifth bits of the first syndrome, respectively, and wherein the sixth through tenth AND gates generate sixth through tenth intermediate bits, respectively;

a fifth binary adder circuit, connected to the sixth and seventh AND gates, for determining a fifth binary sum that is a sum of the sixth and seventh intermediate bits;

a sixth binary adder circuit, connected to the eighth and ninth AND gates, for determining a sixth binary sum that is a sum of the eighth and ninth intermediate bits;

a seventh binary adder circuit, connected to the tenth AND gate and the sixth binary adder circuit, for determining a seventh binary sum that is a sum of the tenth intermediate bit and the sixth binary sum;

an eighth binary adder circuit, connected to the fifth and seventh binary adder circuits, for determining an eighth binary sum that is a sum of the fifth and seventh binary sums;

a third set of AND gates including eleventh through fifteenth AND gates, wherein the eleventh AND gate receives the first bit of the first syndrome and a third bit of the second syndrome, and wherein the twelfth through fifteenth AND gates receive the third bit of the first through fourth intermediate products and the second through fifth bits of the first syndrome, respectively, and wherein the eleventh through fifteenth AND gates generate eleventh through fifteenth intermediate bits, respectively;

a ninth binary adder circuit, connected to the eleventh and twelfth AND gates, for determining a ninth binary sum that is a sum of the eleventh and twelfth intermediate bits;

a tenth binary adder circuit, connected to the thirteenth and fourteenth AND gates, for determining a tenth binary sum that is a sum of the thirteenth and fourteenth intermediate bits;

an eleventh binary adder circuit, connected to the fifteenth AND gate and the tenth binary adder circuit, for determining an eleventh binary sum that is a sum of the fifteenth intermediate bit and the tenth binary sum;

a twelfth binary adder circuit, connected to the ninth and eleventh binary adder circuits, for determining a twelfth binary sum that is a sum of the ninth and eleventh binary sums;

a fourth set of AND gates including sixteenth through twentieth AND gates, wherein the sixteenth AND gate receives the first bit of the first syndrome and a fourth bit of the second syndrome, and wherein the seventeenth through twentieth AND gates receive the fourth bit of the first through fourth intermediate products and the second through fifth bits of the first syndrome, respectively, and wherein the sixteenth through twentieth AND gates generate sixteenth through twentieth intermediate bits, respectively;

a thirteenth binary adder circuit, connected to the sixteenth and seventeenth AND gates, for determining a thirteenth binary sum that is a sum of the sixteenth and seventeenth intermediate bits;

a fourteenth binary adder circuit, connected to the eighteenth and nineteenth AND gates, for determining a fourteenth binary sum that is a sum of the eighteenth and nineteenth intermediate bits;

a fifteenth binary adder circuit, connected to the twentieth AND gate and the fourteenth binary adder circuit, for determining a fifteenth binary sum that is a sum of the twentieth intermediate bit and the fourteenth binary sum;

a sixteenth binary adder circuit, connected to the thirteenth and fifteenth binary adder circuits, for determining a sixteenth binary sum that is a sum of the thirteenth and fifteenth binary sums;

a fifth set of AND gates including twenty-first through twenty-fifth AND gates, wherein the twenty-first AND gate receives the first bit of the first syndrome and a fifth bit of the second syndrome, and wherein the twenty-second through twenty-fifth AND gates receive the fifth bit of the first through fourth intermediate products and the second through fifth bits of the first syndrome, respectively, and wherein the twenty-first through twenty-fifth AND gates generate twenty-first through twenty-fifth intermediate bits, respectively;

a seventeenth binary adder circuit, connected to the twenty-first and twenty-second AND gates, for determining a seventeenth binary sum that is a sum of the twenty-first and twenty-second intermediate bits;

an eighteenth binary adder circuit, connected to the twenty-third and twenty-fourth AND gates, for determining an eighteenth binary sum that is a sum of the twenty-third and twenty-fourth intermediate bits;

a nineteenth binary adder circuit, connected to the twenty-fifth AND gate and the eighteenth binary adder circuit, for determining a nineteenth binary sum that is a sum of the twenty-fifth intermediate bit and the nineteenth binary sum; and a twentieth binary adder circuit, connected to the seventeenth and nineteenth binary adder circuits, for determining a twentieth binary sum that is a sum of the seventeenth and nineteenth binary sums.

16. The memory device of claim 15, wherein the first finite field inversion circuit comprises:

a first finite field squaring circuit for generating a first squared output corresponding to the first syndrome based on a finite field squaring of the first polynomial, wherein the first squared output includes first through fifth bits;

a second finite field squaring circuit for generating a second squared output based on the finite field squaring of the first squared output, wherein the second squared output includes first through fifth bits;

a third finite field squaring circuit for generating a third squared output based on the finite field squaring of the second squared output, wherein the third squared output includes first through fifth bits;

a fourth finite field squaring circuit for generating a fourth squared output based on the finite field squaring of the third squared output, wherein the fourth squared output includes first through fifth bits;

a seventh polynomial basis multiplier circuit, connected to the first and second finite field squaring circuits, for receiving the first through fifth bits of the first and second squared outputs, respectively, wherein the seventh polynomial basis multiplier circuit determines a seventh product that is a product of the first and second squared outputs, and wherein the seventh product includes first through fifth bits;

an eighth polynomial basis multiplier circuit, connected to the third and fourth finite field squaring circuits, for receiving the first through fifth bits of the third and fourth squared outputs, respectively, wherein the eighth polynomial basis multiplier circuit determines an eighth product that is a product of the third and fourth squared outputs, and wherein the eighth product includes first through fifth bits; and a ninth polynomial basis multiplier circuit, connected to the seventh and eighth polynomial basis multiplier circuits, for receiving the first through fifth bits of the seventh and eighth products, wherein the ninth polynomial basis multiplier circuit determines the first inverse that is a product of the eighth and ninth products.

17. The memory device of claim 16, wherein the error bit locator comprises:

a second XOR gate for receiving a load signal and the clock signal and generating a modified clock signal;

a first multiplexer having a first input terminal for receiving the first bit of the first coefficient associated with the error location polynomial, a second input terminal for receiving a first input signal, a select input terminal for receiving the load signal, wherein the first multiplexer selectively provides at least one of the first bit of the first coefficient and the first input signal at an output terminal thereof;

a first flip-flop having an input terminal connected to the output terminal of the first multiplexer for receiving at least one of the first input signal and the first bit of the first coefficient, a clock input terminal for receiving the modified clock signal, wherein the first flip-flop generates a second input signal at an output terminal thereof;

a second multiplexer having a first input terminal for receiving the second bit of the first coefficient associated with the error location polynomial, a second input terminal for receiving the second input signal, a select input terminal for receiving the load signal, wherein the second multiplexer selectively provides at least one of the second bit of the first coefficient and the second input signal at an output terminal thereof;

a second flip-flop having an input terminal connected to the output terminal of the second multiplexer for receiving at least one of the second input signal and the second bit of the first coefficient, a clock input terminal for receiving the modified clock signal, wherein the second flip-flop generates a first intermediate input signal at an output terminal thereof;

a third multiplexer having a first input terminal for receiving the third bit of the first coefficient associated with the error location polynomial, a second input terminal for receiving a third input signal, a select input terminal for receiving the load signal, wherein the third multiplexer selectively provides at least one of the third bit of the first coefficient and the third input signal at an output terminal thereof;

a third XOR gate, connected to the second flip-flop and the third multiplexer, wherein the third XOR gate receives the first input and first intermediate input signals and generates and transmits the third input signal to the third multiplexer;

a third flip-flop having an input terminal connected to the output terminal of the third multiplexer for receiving at least one of the third input signal and the third bit of the first coefficient, a clock input terminal for receiving the modified clock signal, wherein the third flip-flop generates a fourth input signal at an output terminal thereof;

a fourth multiplexer having a first input terminal for receiving the fourth bit of the first coefficient associated with the error location polynomial, a second input terminal for receiving the fourth input signal, a select input terminal for receiving the load signal, wherein the fourth multiplexer selectively provides at least one of the fourth bit of the first coefficient and the fourth input signal at an output terminal thereof;

a fourth flip-flop having an input terminal connected to the output terminal of the fourth multiplexer for receiving at least one of the fourth input signal and the fourth bit of the first coefficient, a clock input terminal for receiving the modified clock signal, wherein the fourth flip-flop generates a fifth input signal at an output terminal thereof;

a fifth multiplexer having a first input terminal for receiving the fifth bit of the first coefficient associated with the error location polynomial, a second input terminal for receiving the fifth input signal, a select input terminal for receiving the load signal, wherein the fifth multiplexer selectively provides at least one of the fifth bit of the first coefficient and the fifth input signal at an output terminal thereof; and a fifth flip-flop having an input terminal connected to the output terminal of the fifth multiplexer for receiving at least one of the fifth input signal and the fifth bit of the first coefficient, a clock input terminal for receiving the modified clock signal, wherein the fifth flip-flop generates the first input signal at an output terminal thereof.

18. The memory device of claim 17, wherein the error bit locator further comprises:

a sixth multiplexer having a first input terminal for receiving the first bit of the second coefficient associated with the error location polynomial, a second input terminal for receiving a sixth input signal, a select input terminal for receiving the load signal, wherein the sixth multiplexer selectively provides at least one of the first bit of the second coefficient and the sixth input signal at an output terminal thereof;

a sixth flip-flop having an input terminal connected to the output terminal of the sixth multiplexer for receiving at least one of the sixth input signal and the first bit of the second coefficient, a clock input terminal for receiving the modified clock signal, wherein the sixth flip-flop generates a second intermediate input signal at an output terminal thereof;

a seventh multiplexer having a first input terminal for receiving the second bit of the second coefficient associated with the error location polynomial, a second input terminal for receiving a seventh input signal, a select input terminal for receiving the load signal, wherein the seventh multiplexer selectively provides at least one of the second bit of the second coefficient and the seventh input signal at an output terminal thereof;

a seventh flip-flop having an input terminal connected to the output terminal of the seventh multiplexer for receiving at least one of the seventh input signal and the second bit of the second coefficient, a clock input terminal for receiving the modified clock signal, wherein the seventh flip-flop generates a third intermediate input signal at an output terminal thereof;

an eighth multiplexer having a first input terminal for receiving the third bit of the second coefficient associated with the error location polynomial, a second input terminal for receiving an eighth input signal, a select input terminal for receiving the load signal, wherein the eighth multiplexer selectively provides at least one of the third bit of the third coefficient and the seventh input signal at an output terminal thereof;

an eighth flip-flop having an input terminal connected to the output terminal of the eighth multiplexer for receiving at least one of the eighth input signal and the third bit of the second coefficient, a clock input terminal for receiving the modified clock signal, wherein the eighth flip-flop generates a tenth input signal at an output terminal thereof;

a fourth XOR gate connected to the sixth flip-flop and the eighth multiplexer, wherein the fourth XOR gate receives the sixth input and second intermediate input signals and generates and transmits the eighth input signal to the eighth multiplexer;

a ninth multiplexer having a first input terminal for receiving the fourth bit of the second coefficient associated with the error location polynomial, a second input terminal for receiving a ninth input signal, a select input terminal for receiving the load signal, wherein the ninth multiplexer selectively provides at least one of the fourth bit of the second coefficient and the ninth input signal at an output terminal thereof;

a ninth flip-flop having an input terminal connected to the output terminal of the ninth multiplexer for receiving at least one of the ninth input signal and the fourth bit of the second coefficient, a clock input terminal for receiving the modified clock signal, wherein the ninth flip-flop generates the sixth input signal at an output terminal thereof;

a fifth XOR gate connected to the seventh flip-flop and the ninth multiplexer, wherein the fifth XOR gate receives the seventh input and third intermediate input signals and generates and transmits the ninth input signal to the ninth multiplexer;

a tenth multiplexer having a first input terminal for receiving the fifth bit of the second coefficient associated with the error location polynomial, a second input terminal for receiving the tenth input signal, a select input terminal for receiving the load signal, wherein the tenth multiplexer selectively provides at least one of the fifth bit of the second coefficient and the tenth input signal at an output terminal thereof; and a tenth flip-flop having an input terminal connected to the output terminal of the tenth multiplexer for receiving at least one of the tenth input signal and the fifth bit of the second coefficient, a clock input terminal for receiving the modified clock signal, wherein the tenth flip-flop generates the seventh input signal at an output terminal thereof.

19. The memory device of claim 18, wherein the error bit locator further comprises:

an eleventh multiplexer having a first input terminal for receiving the first bit of the third coefficient associated with the error location polynomial, a second input terminal for receiving an eleventh input signal, a select input terminal for receiving the load signal, wherein the eleventh multiplexer selectively provides at least one of the first bit of the third coefficient and the eleventh input signal at an output terminal thereof;

an eleventh flip-flop having an input terminal connected to the output terminal of the eleventh multiplexer for receiving at least one of the eleventh input signal and the first bit of the third coefficient, a clock input terminal for receiving the modified clock signal, wherein the eleventh flip-flop generates a fourth intermediate input signal at an output terminal thereof;

a twelfth multiplexer having a first input terminal for receiving the second bit of the third coefficient associated with the error location polynomial, a second input terminal for receiving a twelfth input signal, a select input terminal for receiving the load signal, wherein the twelfth multiplexer selectively provides at least one of the second bit of the third coefficient and the twelfth input signal at an output terminal thereof;

a twelfth flip-flop having an input terminal connected to the output terminal of the twelfth multiplexer for receiving at least one of the twelfth input signal and the second bit of the third coefficient, a clock input terminal for receiving the modified clock signal, wherein the twelfth flip-flop generates a fifth intermediate input signal at an output terminal thereof;

a thirteenth multiplexer having a first input terminal for receiving the third bit of the third coefficient associated with the error location polynomial, a second input terminal for receiving a thirteenth input signal, a select input terminal for receiving the load signal, wherein the thirteenth multiplexer selectively provides at least one of the third bit of the third coefficient and the thirteenth input signal at an output terminal thereof;

a thirteenth flip-flop having an input terminal connected to the output terminal of the thirteenth multiplexer for receiving at least one of the thirteenth input signal and the third bit of the third coefficient, a clock input terminal for receiving the modified clock signal, wherein the thirteenth flip-flop generates the eleventh input signal at an output terminal thereof;

a sixth XOR gate connected to the thirteenth flip-flop and the thirteenth multiplexer, wherein the sixth XOR gate receives the eleventh input signal and a sixth intermediate input signal and generates and transmits the thirteenth input signal to the thirteenth multiplexer;

a fourteenth multiplexer having a first input terminal for receiving the fourth bit of the third coefficient associated with the error location polynomial, a second input terminal for receiving a fourteenth input signal, a select input terminal for receiving the load signal, wherein the fourteenth multiplexer selectively provides at least one of the fourth bit of the third coefficient and the fourteenth input signal at an output terminal thereof;

a fourteenth flip-flop having an input terminal connected to the output terminal of the fourteenth multiplexer for receiving at least one of the fourteenth input signal and the fourth bit of the third coefficient, a clock input terminal for receiving the modified clock signal, wherein the fourteenth flip-flop generates the twelfth input signal at an output terminal thereof;

a seventh XOR gate connected to the fourteenth flip-flop and the fourteenth multiplexer, wherein the seventh XOR gate receives the twelfth input and fourth intermediate input signals and generates and transmits the fourteenth input signal to the fourteenth multiplexer;

a fifteenth multiplexer having a first input terminal for receiving the fifth bit of the third coefficient associated with the error location polynomial, a second input terminal for receiving a fifteenth input signal, a select input terminal for receiving the load signal, wherein the fifteenth multiplexer selectively provides at least one of the fifth bit of the third coefficient and the fifteenth input signal at an output terminal thereof;

a fifteenth flip-flop having an input terminal connected to the output terminal of the fifteenth multiplexer for receiving at least one of the fifteenth input signal and the fifth bit of the third coefficient, a clock input terminal for receiving the modified clock signal, wherein the fifteenth flip-flop generates the sixth intermediate input signal at an output terminal thereof; and an eighth XOR gate connected to the fifteenth and twelfth flip-flops, and the fifteenth multiplexer, wherein the eighth XOR gate receives the fifth and sixth intermediate input signals and generates and transmits the fifteenth input signal to the fifteenth multiplexer.

20. The memory device of claim 19, wherein the error bit locator further comprises:

a ninth XOR gate for receiving the first bit of the fourth coefficient associated with the error location polynomial and output signals generated by the first, sixth, and eleventh flip-flops, respectively, and generating a first intermediate error bit;

a tenth XOR gate for receiving the second bit of the fourth coefficient associated with the error location polynomial and output signals generated by the second, seventh, and twelfth flip-flops, respectively, and generating a second intermediate error bit;

an eleventh XOR gate for receiving the third bit of the fourth coefficient associated with the error location polynomial and output signals generated by the third, eighth, and thirteenth flip-flops, respectively, and generating a third intermediate error bit;

a twelfth XOR gate for receiving the fourth bit of the fourth coefficient associated with the error location polynomial and output signals generated by the fourth, ninth, and fourteenth flip-flops, respectively, and generating a fourth intermediate error bit;

a thirteenth XOR gate for receiving the fifth bit of the fourth coefficient associated with the error location polynomial and output signals generated by the fifth, tenth, and fifteenth flip-flops, respectively, and generating a fifth intermediate error bit; and a NOR gate for receiving the first through fifth intermediate error bits and generating the error match bit.

* * * * *